United States Patent
Akagi

(10) Patent No.: US 9,141,228 B2
(45) Date of Patent: Sep. 22, 2015

(54) INPUT DEVICE

(71) Applicant: Koji Akagi, Inazawa (JP)

(72) Inventor: Koji Akagi, Inazawa (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 198 days.

(21) Appl. No.: 13/847,688

(22) Filed: Mar. 20, 2013

(65) Prior Publication Data

US 2013/0249840 A1    Sep. 26, 2013

(30) Foreign Application Priority Data

Mar. 26, 2012 (JP) .................. 2012-069798

(51) Int. Cl.
| | | |
|---|---|---|
| G06F 3/041 | (2006.01) | |
| H03K 17/96 | (2006.01) | |
| G06F 3/02 | (2006.01) | |

(52) U.S. Cl.
CPC .......... *G06F 3/0418* (2013.01); *H03K 17/9622* (2013.01); *G06F 3/02* (2013.01); *G06F 2203/04108* (2013.01); *H03K 2017/9613* (2013.01)

(58) Field of Classification Search
CPC .......... G06F 3/044; G06F 2203/04108; G06F 2203/04113; G06F 3/02; G06F 3/041
USPC ......... 345/156, 158, 166, 173–179; 178/18–18.09; 463/37–38
See application file for complete search history.

(56) References Cited

U.S. PATENT DOCUMENTS

| | | | | |
|---|---|---|---|---|
| 2008/0006453 | A1* | 1/2008 | Hotelling | 178/18.06 |
| 2010/0139990 | A1* | 6/2010 | Westerman et al. | 178/18.03 |
| 2010/0171723 | A1* | 7/2010 | Kobayashi et al. | 345/174 |
| 2010/0245135 | A1* | 9/2010 | Camacho et al. | 341/33 |

FOREIGN PATENT DOCUMENTS

| | | |
|---|---|---|
| JP | S60-075927 A | 4/1985 |
| JP | 2010-182290 A | 8/2010 |

* cited by examiner

*Primary Examiner* — Lun-Yi Lao
*Assistant Examiner* — Saiful A Siddiqui
(74) *Attorney, Agent, or Firm* — Scully, Scott, Murphy & Presser, P.C.

(57) ABSTRACT

An input device includes a first input detector and a second input detector adjacent to each other. The first input detector includes: a first electrode unit coupled to a first signal line; and a second electrode unit coupled to a second signal line. The second input detector includes: a first electrode unit coupled to the first signal line; and a third electrode unit coupled to a third signal line. The first input detector and the second input detector are arranged in one of a state in which the first electrode unit of the first input detector and the first electrode unit of the second input detector are adjacent to each other and a state in which the second electrode unit of the first input detector and the third electrode unit of the second input detector are adjacent to each other.

13 Claims, 15 Drawing Sheets

FIG.4

|       | SEN04          | SEN05          | SEN06          |
|-------|----------------|----------------|----------------|
| SEN00 | TOUCH BUTTON 1 | TOUCH BUTTON 2 | TOUCH BUTTON 3 |
| SEN01 | TOUCH BUTTON 4 | TOUCH BUTTON 5 | TOUCH BUTTON 6 |
| SEN02 | TOUCH BUTTON 7 | TOUCH BUTTON 8 | TOUCH BUTTON 9 |
| SEN03 | TOUCH BUTTON * | TOUCH BUTTON 0 | TOUCH BUTTON # |

INPUT DEVICE

CROSS REFERENCE TO RELATED APPLICATION

The present application claims priority from Japanese Patent Application No. 2012-069798, which was filed on Mar. 26, 2012, the disclosure of which is herein incorporated by reference in its entirety.

BACKGROUND

1. Field of the Invention

The present invention relates to an input device provided with a plurality of input buttons.

2. Description of the Related Art

Examples of an input device provided with a plurality of input buttons include an electrostatic capacitance touch panel. The electrostatic capacitance touch panel is designed to perform a button operation by utilizing a change in an electrostatic capacity caused when an input object contacts or approaches an input button. In such a touch panel, one or more electrodes are provided for each input button. Each electrode is connected to a corresponding one of signal lines each for outputting an output value, so that an increase in the number of input buttons tends to increase the number of signal lines. However, since complexity of routing increases with increase in the number of signal lines, the number of signal lines is preferably small.

In light of this situation, there is known an input device in which two types of electrodes, namely, a first electrode and a second electrode constitute one input button. The input device is provided with a plurality of input buttons each as the one input button, and the first electrodes of input buttons adjacent to each other are connected to the same signal line. This design can reduce the number of signal lines. It is noted that, in the input device in which two types of electrodes constitute one input button, a button operation is performed by utilizing a combination of the first electrode and the second electrode whose electrostatic capacities have been changed.

SUMMARY

The above-described input device can reduce the number of signal lines by utilizing the combination of the first electrode and the second electrode to perform the button operation. However, the reduction in the number of signal lines also reduces the number of combinations of the first electrode and the second electrode, leading to a button operation unintended by a user. Specifically, in a case where an input object approaches a position between two adjacent input buttons, it may be determined that one of the two input buttons has been operated. This erroneous operation is caused in a case where, as will be explained later in detail, a combination of a first electrode and a second electrode on one input button is the same as a combination of the first electrode on the one button and a second electrode on a button adjacent to the one button, for example.

This invention has been developed to provide an input device capable of reducing the number of signal lines and preventing a situation in which the input device receives an input result unintended by a user due to a button operation.

The present invention provides an input device, comprising: a plurality of input detectors comprising a first input detector and a second input detector which are adjacent to each other, wherein the first input detector comprises: a first electrode unit coupled to a first signal line and configured to output an output value to the first signal line, wherein the output value is based on an electrostatic capacity produced between the first electrode unit and an input object when the input object approaches or contacts the first electrode unit; and a second electrode unit coupled to a second signal line that differs from the first signal line, the second electrode unit being configured to output an output value to the second signal line, wherein the output value is based on an electrostatic capacity produced between the second electrode unit and the input object when the input object approaches or contacts the second electrode unit, wherein the second input detector comprises: a first electrode unit different from the first electrode unit of the first input detector, the first electrode unit of the second input detector being coupled to the first signal line and configured to output an output value to the first signal line, wherein the output value is based on an electrostatic capacity produced between the first electrode unit of the second input detector and the input object when the input object approaches or contacts the first electrode unit of the second input detector; and a third electrode unit coupled to a third signal line that differs from the first signal line and the second signal line, the third electrode unit being configured to output an output value to the third signal line, wherein the output value is based on an electrostatic capacity produced between the third electrode unit and the input object when the input object approaches or contacts the third electrode unit, wherein the input device further comprises: a storage configured to store at least (i) information representing that the first input detector is associated with the first signal line and the second signal line and (ii) information representing that the second input detector is associated with the first signal line and the third signal line; and an output-value receiver coupled to the first signal line, the second signal line, and the third signal line, the output-value receiver being configured to, upon receipt of the output value output from the first signal line and one of the output value output from the second signal line and the output value output from the third signal line, receive, based on the information stored in the storage, an input to one of the first input detector and the second input detector which one is associated with the first signal line and one of the second signal line and the third signal line which have output the output values received by the output-value receiver, wherein the first input detector and the second input detector are arranged in one of a state in which the first electrode unit of the first input detector and the first electrode unit of the second input detector are adjacent to each other and a state in which the second electrode unit of the first input detector and the third electrode unit of the second input detector are adjacent to each other.

BRIEF DESCRIPTION OF THE DRAWINGS

The objects, features, advantages, and technical and industrial significance of the present invention will be better understood by reading the following detailed description of embodiments of the invention, when considered in connection with the accompanying drawings, in which:

FIG. 4 is a table representing correspondences among a sensor value of a first electrode, a sensor value of a second electrode, and a touch button;

DETAILED DESCRIPTION OF THE EMBODIMENTS

<First Embodiment>

Figure 1:
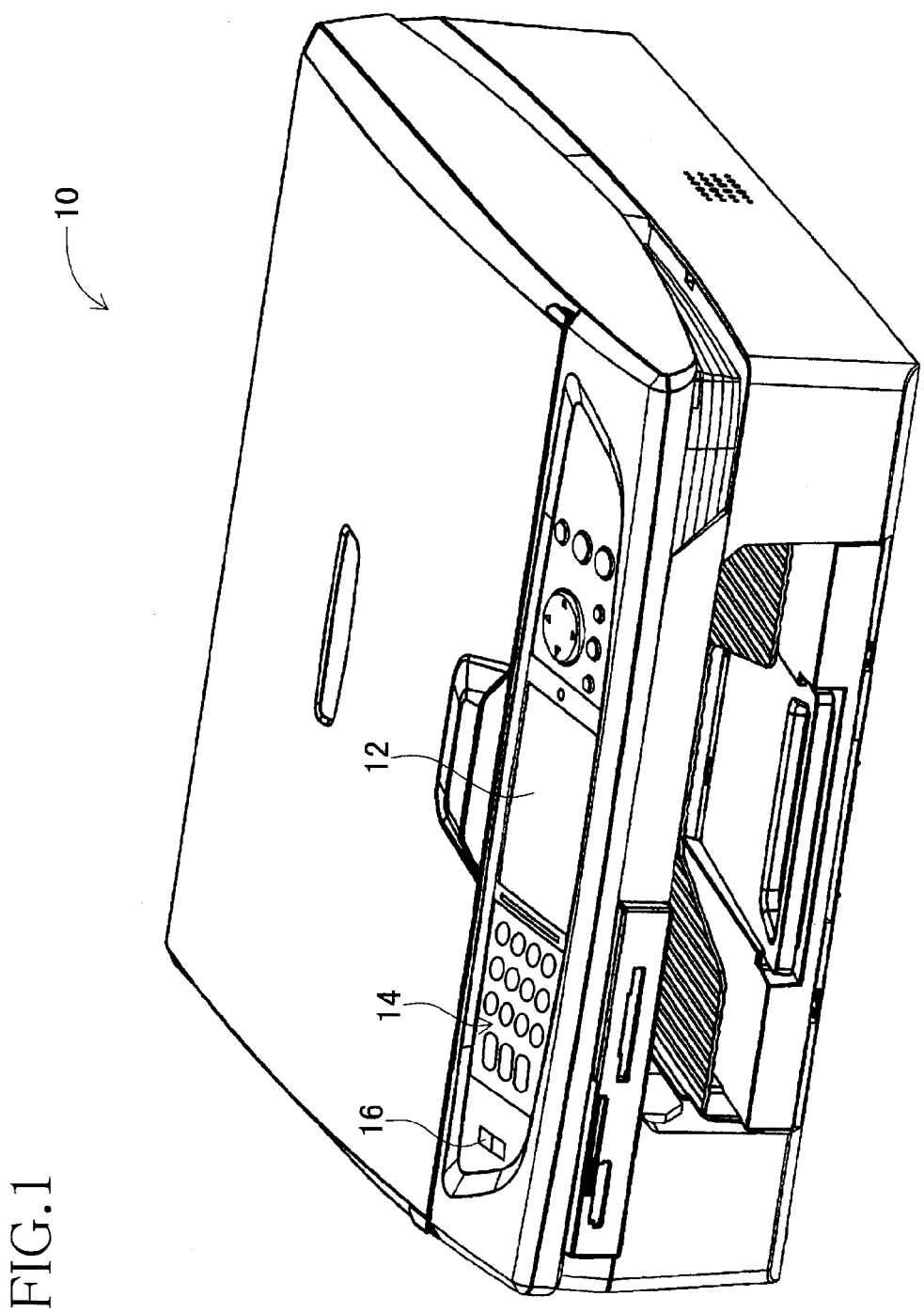
FIG. 1 is a perspective view illustrating an MFP 10.

FIG. 1 illustrates a multi-function peripheral (MFP) according to a first embodiment of the present invention. This MFP 10 has various functions such as a facsimile function, a printing function, a scanning function, and a copying function. Provided on a front central portion of an upper face of the MFP 10 is a display panel 12 for displaying various information of the functions of the MFP 10. A touch panel 14 is provided on a left side of the display panel 12. The MFP 10 performs various operations in response to a user's input on the touch panel 14. Also, a mechanical main power switch 16 is provided on a left side of the touch panel 14.

The touch panel 14 is an electrostatic capacitance touch panel that includes: a board or a substrate 18 (see FIG. 3) on which the plurality of electrodes are arranged; and a transparent top coat covering the board 18. Signs such as numbers are described on the top coat, and the electrodes are arranged at positions respectively opposed to the signs. Each touch button is constituted by two or more electrodes and a sign. When a user contacts or approaches the touch button with his or her finger, a button input is performed.

Figure 2A:
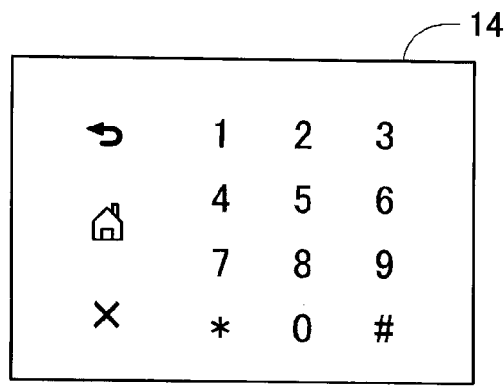
FIGS. 2A-2C are views each schematically illustrating a touch panel 14.

As illustrated in FIG. 2A, the touch panel 14 is constituted by twelve touch buttons arranged like a numeric keypad and three touch buttons arranged vertically in a line. The twelve numeric-keypad touch buttons are respectively for inputting the numbers "0"-"9" and signs "*" and "#", and the vertically-arranged three touch buttons are for instructing the MFP 10 to perform their respective functions.

Light-emitting members, not shown, are arranged such that each element is sandwiched between the top coat and a corresponding one of the electrodes. For each element, an LED, not shown, is disposed near the light-emitting member, and when the LED emits light, the light-emitting member is illuminated. Thus, the touch panel 14 can display only a part of the touch buttons which needs to be displayed.

Figure 2B:
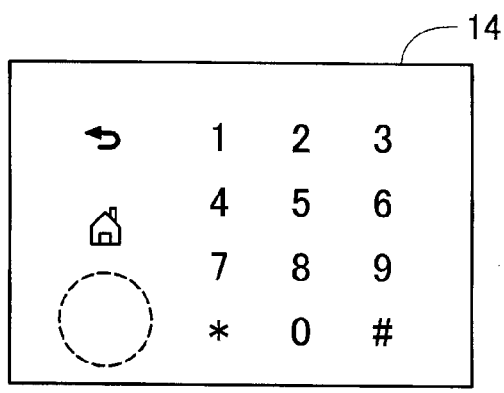
Figure 2C:
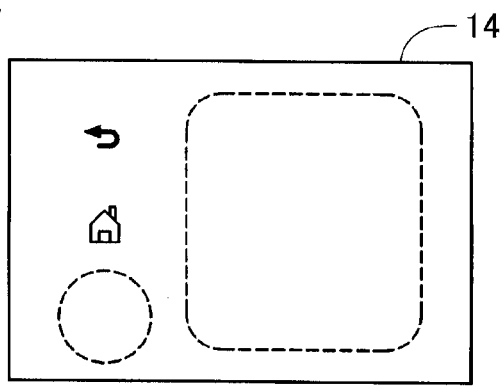

Specifically, when the LEDs respectively corresponding to all the touch buttons emit light, for example, all the touch buttons are displayed as illustrated in FIG. 2A. In a case where the touch button corresponding to the sign "x" (hereinafter may be referred to as "touch button "x"" which may be applied to other signs and numbers) does not need to be displayed among the vertically-arranged three touch buttons, the LED corresponding to the touch button "x" is instructed not to emit the light, so that the touch button "x" is not displayed as illustrated in FIG. 2B. Also, in a case where the twelve numeric-keypad touch buttons do not need to be displayed either, the LEDs respectively corresponding to the twelve numeric-keypad touch buttons are instructed not to emit the light, so that the twelve numeric-keypad touch buttons are not displayed as illustrated in FIG. 2C. As a result, it is possible to prevent the user from erroneously operating unnecessary touch buttons.

Here, the board 18 of the touch panel 14 will be explained specifically. However, since the twelve numeric-keypad touch buttons and the vertically-arranged three touch buttons have a similar structure, only the board 18 for the twelve numeric-keypad touch buttons will be explained.

Figure 3:
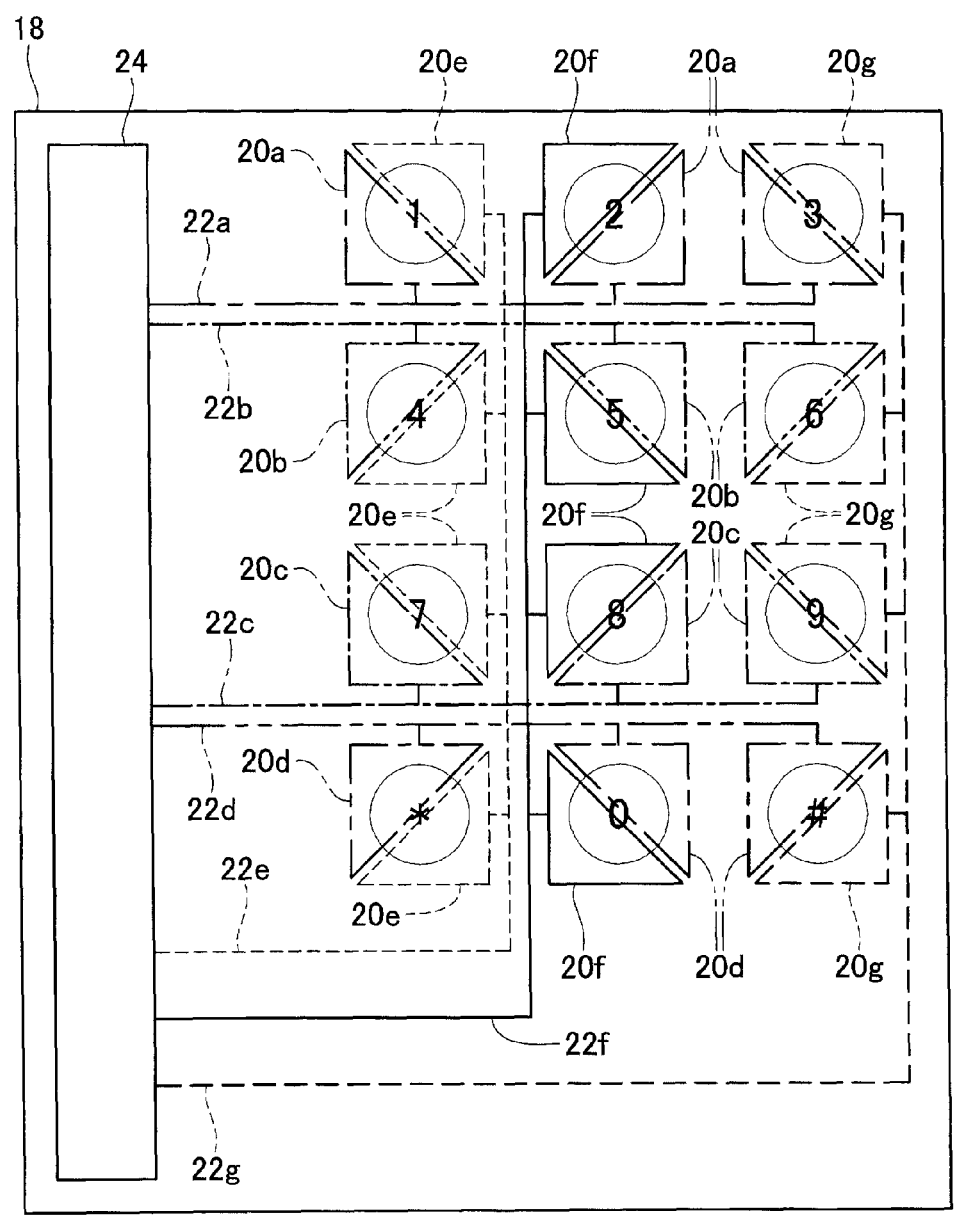
FIG. 3 is a view schematically illustrating a board 18 in a first embodiment.

As illustrated in FIG. 3, a plurality of electrodes 20, a plurality of signal lines 22, and an IC 24 are arranged on the board 18 of the touch panel 14. Each of the signal lines 22 is connected to a corresponding one or ones of the electrodes 20, and the IC 24 is designed to receive an output value from each of the signal lines 22. Each of the electrodes 20 has a shape of an isosceles right triangle. Each pair of the electrodes 20 are arranged, with their respective hypotenuses facing each other. These two electrodes 20 form a touch area for one touch button. That is, in the case of the board 18 for the twelve numeric-keypad touch buttons, the twenty-four electrodes 20 form twelve touch areas respectively for twelve touch buttons. It is noted that each touch area has a square shape.

Since each of the electrodes 20 has the triangle shape, a rectangular input button can be constituted by two electrodes 20, resulting in a relatively large contact area of the input button.

The twelve touch areas are arranged in three columns and four rows. On the top coat covering the board 18, the numbers "0"-"9" and the two signs "*" and "#" are described in a telephone keypad arrangement at positions respectively opposed to the twelve touch areas. Thus, on the uppermost row, a left touch area corresponds to the number "1", a central touch area corresponds to the number "2", and a right touch area corresponds to the number "3". On the second row from the top, a left touch area corresponds to the number "4", a central touch area corresponds to the number "5", and a right touch area corresponds to the number "6". On the third row from the top, a left touch area corresponds to the number "7", a central touch area corresponds to the number "8", and a right touch area corresponds to the number "9". On the lowermost row, a left touch area corresponds to the sign "*", a central touch area corresponds to the number "0", and a right touch area corresponds to the sign "#". In the following explanation, "the touch area corresponding to the number or sign "x"" may be referred to as "the touch area "x"".

Each two electrodes 20 constituting one touch area are arranged such that two touch areas adjacent or next to each other are symmetrical to each other. Specifically, in the touch area "1", for example, one of the two electrodes 20 is disposed such that the right angle of its isosceles right triangle is located at a lower left portion of the touch area "1", and the other of the two electrodes 20 is disposed such that the right angle of its isosceles right triangle is located at an upper right portion of the touch area "1". In each of the touch area "2" located on a right side of the touch area "1" and the touch area "4" located on a lower side of the touch area "1", on the other hand, one of the two electrodes 20 is disposed such that the right angle of its isosceles right triangle is located at a lower right portion of the touch area, and the other of the two electrodes 20 is disposed such that the right angle of its isosceles right triangle is located at an upper left portion of the touch area.

Also, each of the electrodes 20 is connected to a corresponding one of the signal lines 22 each routed so as to extend in or correspond to a direction in which corresponding touch areas are arranged. Specifically, the signal lines 22 are routed so as to correspond to the three columns and four rows of the touch areas. That is, seven signal lines 22 are routed on the board 18.

For easier understanding, the seven signal lines 22 may be called signal lines 22a-22g in the following explanation. Specifically, the signal line 22 corresponding to the touch areas arranged in the uppermost row is a signal line 22a, the signal line 22 corresponding to the touch areas arranged in the second row from the top is a signal line 22b, the signal line 22 corresponding to the touch areas arranged in the third row from the top is a signal line 22c, and the signal line 22 corresponding to the touch areas arranged in the lowermost row is a signal line 22d. Also, the signal line 22 corresponding to the touch areas arranged in the left column is a signal line 22e, the signal line 22 corresponding to the touch areas arranged in the central column is a signal line 22f, and the signal line 22 corresponding to the touch areas arranged in the right column is a signal line 22g.

Each of the signal lines 22 is connected to one of the two electrodes 20 located on each of the touch areas arranged in a corresponding one of the rows and columns. That is, each of the signal lines 22a-22d respectively corresponding to the rows of the touch areas is connected to one of the electrodes 20 of each of the three touch areas arranged in a corresponding one of the rows, and each of the signal lines 22e-22g respectively corresponding to the columns of the touch areas is connected to one of the electrodes 20 of each of the four touch areas arranged in a corresponding one of the columns.

The signal lines 22 and the electrodes 20 are connected to one another in a predetermined pattern.

There will be explained, by way of specific example, the signal line 22a corresponding to the touch areas arranged in the uppermost row. The signal line 22a is connected to: an electrode 20a disposed on the lower left portion of the touch area "1"; an electrode 20a disposed on a lower right portion of the touch area "2"; and an electrode 20a disposed on a lower left portion of the touch area "3". On the other hand, an electrode 20e disposed on an upper right portion of the touch area "1" is connected to the signal line 22e, an electrode 20f disposed on an upper left portion of the touch area "2" is connected to the signal line 22f, and an electrode 20g disposed on an upper right portion of the touch area "3" is connected to the signal line 22g. Focusing on the touch area "1" (as one example of a first input detector) and the touch area "2" (as one example of a second input detector), the touch area "1" contains the electrode 20a (as one example of a first electrode unit) connected to the signal line 22a (as one example of a first signal line) and the electrode 20e (as one example of a second electrode unit) connected to the signal line 22e (as one example of a second signal line). Also, the touch area "2" disposed in the same row as the touch area "1" and adjacent to the touch area "1" contains the electrode 20a connected to the signal line 22a and the electrode 20f (as one example of a third electrode unit) connected to the signal line 22f (as one example of a third signal line).

Focusing on the touch area "2" (as one example of the first input detector) and the touch area "3" (as one example of the second input detector), the touch area "2" contains the electrode 20a (as one example of the first electrode unit) connected to the signal line 22a (as one example of the first signal line) and the electrode 20f (as one example of the second electrode unit) connected to the signal line 22f (as one example of the second signal line). Also, the touch area "3" disposed in the same row as the touch area "2" and adjacent to the touch area "2" contains the electrode 20a (as one example of the first electrode unit) connected to the signal line 22a (as one example of the first signal line) and the electrode 20g (as one example of the third electrode unit) connected to the signal line 22g (as one example of the third signal line).

In the arrangement of the signal lines and the electrodes as described above, in the touch areas "1" and "2", the electrode 20e disposed on the touch area "1" and the electrode 20f disposed on the touch area "2" are arranged adjacent to each other, allowing, as will be described later, determination of whether any of the touch areas "1" and "2" has been pressed. Likewise, in the touch areas "2" and "3", the electrode 20a disposed on the touch area "2" and the electrode 20a disposed on the touch area "3" are arranged adjacent to each other, allowing, as will be described later, determination of whether any of the touch areas "2" and "3" has been pressed.

Also, the state in which the electrode 20e (as one example of the second electrode unit) disposed on the touch area "1" (as one example of the first input detector) and the electrode 20f (the third electrode unit) of the touch area "2" (as one example of the second input detector) are adjacent to each other means that the electrode 20a (as one example of the first electrode unit) disposed on the touch area "1" (as one example of the first input detector) and the electrode 20a (as one example of the first electrode unit) disposed on the touch area "2" (as one example of the second input detector) are not arranged between the electrode 20e (as one example of the second electrode unit) disposed on the touch area "1" (as one example of the first input detector) and the electrode 20f (as one example of the third electrode unit) disposed on the touch area "2" (as one example of the second input detector). Also, the state in which the electrode 20a (as one example of the first electrode unit) disposed on the touch area "2" (as one example of the first input detector) and the electrode 20a (as one example of the first electrode unit) disposed on the touch area "3" (as one example of the second input detector) are adjacent to each other means that the electrode 20f (as one example of the second electrode unit) disposed on the touch area "2" (as one example of the first input detector) and the electrode 20g (as one example of the third electrode unit) disposed on the touch area "3" (as one example of the second input detector) are not arranged between the electrode 20a (as one example of the first electrode unit) disposed on the touch area "2" (as one example of the first input detector) and the electrode 20a (as one example of the first electrode unit) disposed on the touch area "3" (as one example of the second input detector).

Also, in the arrangement of the signal lines and the electrodes as described above, in the touch areas "1" and "2", the electrode 20a (as one example of the first electrode unit) disposed on the touch area "1" (as one example of the first input detector) and connected to the signal line 22a (as one example of the first signal line) is not adjacent to the electrode 20f (as one example of the third electrode unit) disposed on the touch area "2" (as one example of the second input detector) and connected to the signal line 22f (as one example of the third signal line). In other words, the electrode 20e (as one example of the second electrode unit) disposed on the touch area "1" (as one example of the first input detector) is disposed between the electrode 20a (as one example of the first electrode unit) disposed on the touch area "1" (as one example of the first input detector) and the electrode 20f (as one example of the third electrode unit) disposed on the touch area "2" (as one example of the second input detector). Also, in the touch areas "2" and "3", the electrode 20a (as one example of the first electrode unit) disposed on the touch area "2" (as one example of the first input detector) and connected to the signal line 22a (as one example of the first signal line) is not adjacent to the electrode 20g (as one example of the third electrode unit) disposed on the touch area "3" (as one example of the second input detector) and connected to the signal line 22g (as one example of the third signal line). In other words, the electrode 20a (as one example of the first electrode unit) disposed on the touch area "3" (as one example of the second input detector) is disposed between the electrode 20a (as one example of the first electrode unit) disposed on the touch area "2" (as one example of the first input detector) and the electrode 20g (as one example of the third electrode unit) disposed on the touch area "3" (as one example of the second input detector). It is noted that the electrodes 20 connected to the respective signal lines 22a-22g may be respectively referred to as the electrodes 20a-20g.

There will be next explained the signal line 22e corresponding to the left column of the touch areas. The signal line 22e is connected to: the electrode 20e disposed on the upper right portion of the touch area "1"; an electrode 20e disposed on a lower right portion of the touch area "4"; an electrode 20e disposed on an upper right portion of the touch area "7"; and an electrode 20e disposed on a lower right portion of the touch area "*". On the other hand, the electrode 20a disposed on the lower left portion of the touch area "1" is connected to the signal line 22a, an electrode 20b disposed on an upper left portion of the touch area "4" is connected to the signal line 22b, an electrode 20c disposed on a lower left portion of the touch area "7" is connected to the signal line 22c, and an electrode 20d disposed on an upper left portion of the touch area "*" is connected to the signal line 22d.

Focusing on the touch area "1" (as one example of the first input detector) and the touch area "4" (as one example of the second input detector), the touch area "1" contains the electrode 20e (as one example of the first electrode unit) connected to the signal line 22e (as one example of the first signal line) and the electrode 20a (as one example of the second electrode unit) connected to the signal line 22a (as one example of the second signal line). Also, the touch area "4" disposed in the same column as the touch area "1" and adjacent to the touch area "1" contains the electrode 20e connected to the signal line 22e and the electrode 20b (as one example of the third electrode unit) connected to the signal line 22b (as one example of the third signal line).

Focusing on the touch area "4" (as one example of the first input detector) and the touch area "7" (as one example of the second input detector), the touch area "4" contains the electrode 20e (as one example of the first electrode unit) connected to the signal line 22e (as one example of the first signal line) and the electrode 20b (as one example of the second electrode unit) connected to the signal line 22b (as one example of the second signal line). Also, the touch area "7" disposed in the same column as the touch area "4" and adjacent to the touch area "4" contains the electrode 20e (as one example of the first electrode unit) connected to the signal line 22e (as one example of the first signal line) and the electrode 20c (as one example of the third electrode) connected to the signal line 22c (as one example of the third signal line).

In the arrangement of the signal lines and the electrodes as described above, in the touch areas "1" and "4", the electrode 20a disposed on the touch area "1" and the electrode 20b disposed on the touch area "4" are arranged adjacent to each other, allowing, as will be described later, determination of whether any of the touch areas "1" and "4" has been pressed. Likewise, in the touch areas "4" and "7", the electrode 20e disposed on the touch area "4" and the electrode 20e disposed on the touch area "7" are arranged adjacent to each other, allowing, as will be described later, determination of whether any of the touch areas "4" and "7" has been pressed.

Also, in the touch areas "1" and "4", the electrode 20e (as one example of the first electrode unit) disposed on the touch area "1" (as one example of the first input detector) is not adjacent to the electrode 20b (as one example of the third electrode unit) disposed on the touch area "4" (as one example of the second input detector). In other words, the electrode 20a (as one example of the second electrode unit) disposed on the touch area "1" (as one example of the first input detector) is disposed between the electrode 20e (as one example of the first electrode unit) disposed on the touch area "1" (as one example of the first input detector) and the electrode 20b (as one example of the third electrode unit) disposed on the touch area "4" (as one example of the second input detector), and the electrode 20e (as one example of the first electrode unit) disposed on the touch area "4" (as one example of the first input detector) is not adjacent to the electrode 20c (as one example of the third electrode unit) disposed on the touch area "7" (as one example of the second input detector). In other words, the electrode 20e (as one example of the first electrode unit) disposed on the touch area "7" (as one example of the second input detector) is disposed between the electrode 20e (as one example of the first electrode unit) disposed on the touch area "4" (as one example of the first input detector) and the electrode 20c (as one example of the third electrode unit) disposed on the touch area "7" (as one example of the second input detector). Also, the electrode 20e (as one example of the first electrode unit) disposed on the touch area "7" (as one example of the first input detector) is not adjacent to the electrode 20d (as one example of the third electrode unit) disposed on the touch area "*" (as one example of the second input detector). In other words, the electrode 20c (as one example of the second electrode unit) disposed on the touch area "7" (as one example of the first input detector) is disposed between the electrode 20e (as one example of the first electrode unit) disposed on the touch area "7" (as one example of the second input detector) and the electrode 20d (as one example of the third electrode unit) disposed on the touch area "*" (as one example of the second input detector).

Focusing on the touch area "1" (as one example of the first input detector), the touch area "2" (as one example of the second input detector), and the touch area "4" (as one example of a third input detector), the touch area "1" contains the electrode 20a (as one example of the first electrode unit) connected to the signal line 22a (as one example of the first signal line) and the electrode 20e (as one example of the second electrode unit) connected to the signal line 22e (as one example of the second signal line). Also, the touch area "2" disposed in the same row as the touch area "1" and adjacent to the touch area "1" contains the electrode 20a (as one example of the first electrode unit) connected to the signal line 22a (as one example of the first signal line) and the electrode 20f (as one example of the third electrode unit) connected to the signal line 22f (as one example of the third signal line). Also, the column containing the touch area "1" (as one example of the first input detector) and the touch area "4" (as one example of the third input detector) extends in a direction (as one example of a second direction) intersecting a direction (as one example of a first direction) in which the row containing the touch area "1" and the touch area "2" extends. Furthermore, the touch area "4" (as one example of the third input detector) contains the electrode 20e (as one example of the second electrode unit) connected to the signal line 22e (as one example of the second signal line) and the electrode 20b (as one example of a fourth electrode unit) connected to the signal line 22b (as one example of the fourth signal line). In the arrangement of the signal lines and the electrodes as described above, the electrode 20e disposed on the touch area "1" and the electrode 20f disposed on the touch area "2" are adjacent to each other in the touch areas "1" and "2", and the electrode 20a disposed on the touch area "1" and the electrode 20b disposed on the touch area "4" are adjacent to each other in the touch areas "1" and "4", allowing, as will be described later, determination of whether any of the touch areas "1", "2" and "4" has been pressed.

Focusing on the touch area "2" (as one example of the first input detector), the touch area "3" (as one example of the second input detector), and the touch area "5" (as one example of the third input detector), the touch area "2" contains the electrode 20a (as one example of the first electrode unit) connected to the signal line 22a (as one example of the first signal line) and the electrode 20f (as one example of the second electrode unit) connected to the signal line 22f (as one example of the second signal line). Also, the touch area "3" disposed in the same row as the touch area "2" and adjacent to the touch area "2" contains the electrode 20a (as one example of the first electrode unit) connected to the signal line 22a and the electrode 20g (as one example of the third electrode unit) connected to the signal line 22g (as one example of the third signal line). Also, the column containing the touch area "2" and the touch area "5" extends in a direction (as one example of the second direction) intersecting a direction (as one example of the first direction) in which the row containing the touch area "2" and the touch area "3" extends. Furthermore, the touch area "5" (as one example of the third input detector) contains an electrode 20f (as one example of the second electrode unit) connected to the signal line 22f (as one example of the second signal line) and an electrode 20b (as one example of the fourth electrode unit) connected to the signal line 22b (as one example of the fourth signal line). In the arrangement of the signal lines and the electrodes as described above, the electrode 20a disposed on the touch area "2" and the electrode 20a disposed on the touch area "3" are adjacent to each other in the touch areas "2" and "3", and the electrode 20a disposed on the touch area "2" and the electrode 20b disposed on the touch area "5" are arranged adjacent to each other in the touch areas "2" and "5", allowing, as will be described later, determination of whether any of the touch areas "2", "3" and "5" has been pressed.

As described above, each of the signal lines 22a-22g is connected to corresponding ones of the electrode 20a-20g, and two electrodes respectively connected to two different signal lines 22 are arranged on one touch area. Each of the electrodes 20 is designed such that, when an input object such as a user's finger approaches the electrode 20, the electrode 20 outputs a sensor value to a corresponding one of the signal lines 22, on the basis of a change in an electrostatic capacity. In this design, when the input object approaches one touch area, the two electrodes 20 respectively output sensor values to two different signal lines 22. Thus, when the input object approaches one touch area, two different types of sensor values are input to the IC 24, and determination of which touch area has been pressed is made on the basis of the two different sensor values input to the IC 24. That is, it is determined which of the touch buttons has been pressed among the touch buttons corresponding to the numbers "0"-"9" and the signs "*" and "#".

Specifically, when two sensor values are input to the IC 24 in one of combinations illustrated in FIG. 4, it is determined that a touch button corresponding to the two sensor values has been pressed. It is noted that "SEN00"-"SEN06" illustrated in FIG. 4 respectively represent sensor values output from the respective electrodes 20a-20g. For example, when the sensor values SEN00 and SEN04 are input, that is, when sensor values are output from the electrode 20a and the electrode 20e, it is determined that the touch button "1" has been pressed.

<Processing for Determining Touch Button>

Figure 5:
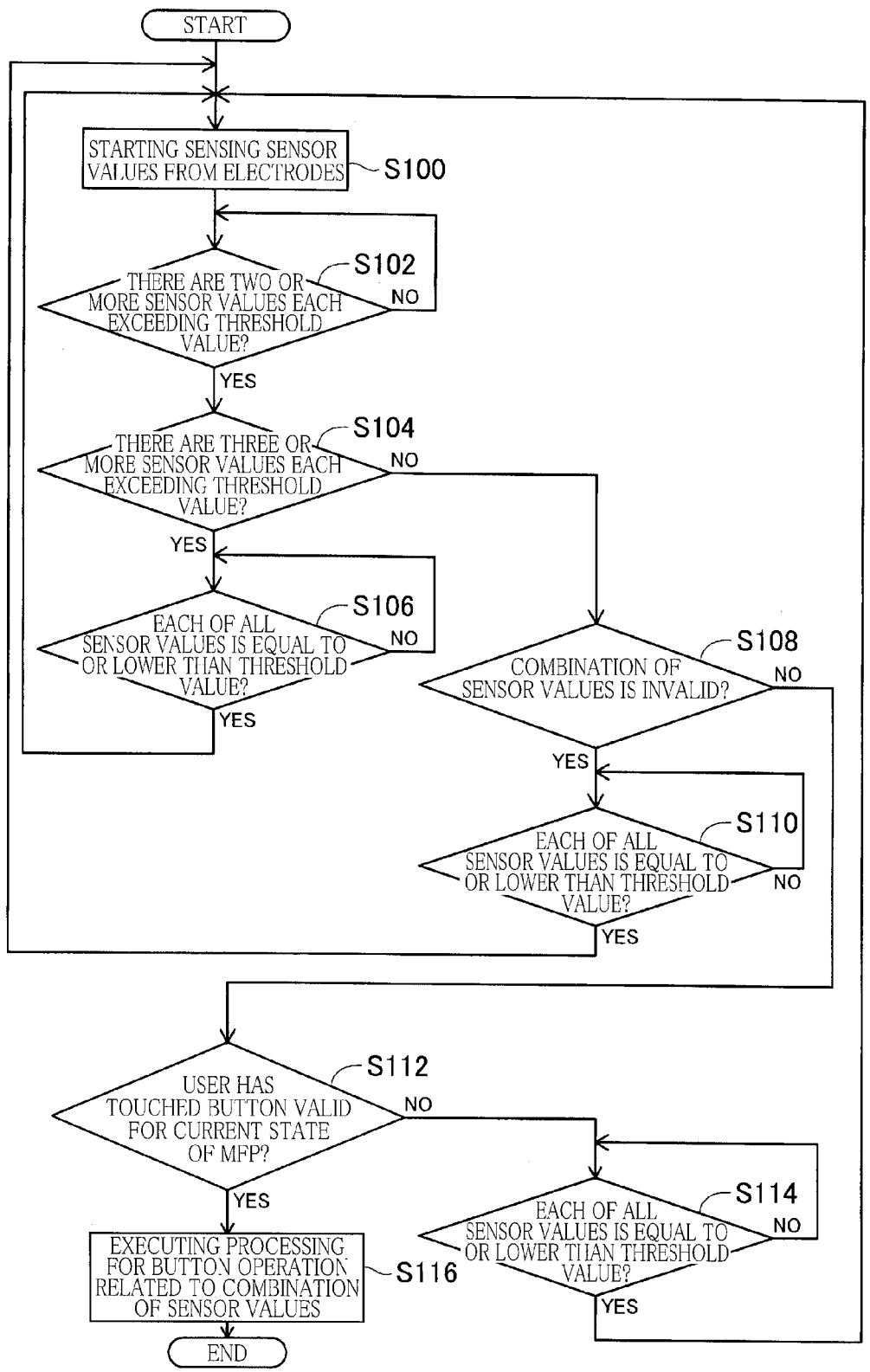
FIG. 5 is a flow chart for a button operation.

There will be next explained, with reference to a flow illustrated in FIG. 5, a processing for determining which touch button has been pressed. This flow begins with S100 at which the IC 24 starts sensing or checks the sensor values transmitted from the electrodes. At S102, the IC 24 determines whether or not there are two or more sensor values each exceeding a threshold value. When there are two or more sensor values each exceeding the threshold value (S102: YES), this flow goes to S104. On the other hand, when there is one or less sensor value exceeding the threshold value (S102: NO), this flow repeats the processing at S102.

At S104, the IC 24 determines whether or not there are three or more sensor values each exceeding the threshold value. When there are three or more sensor values each exceeding the threshold value (S104: YES), this flow goes to S106. At S106, the IC 24 determines whether or not each of all the sensor values is equal to or lower than the threshold value. When each of all the sensor values is equal to or lower than the threshold value (S106: YES), this flow returns to S100. On the other hand, when not all the sensor values are each equal to or lower than the threshold value (S106: NO), this flow repeats the processing at S106.

On the other hand, when there are two or less sensor values each exceeding the threshold value (S104: NO), this flow goes to S108. At S108, the IC 24 determines whether the combination of the sensor values is invalid or not. Specifically, the IC 24 determines whether the combination of the sensor values exists in the table illustrated in FIG. 4 or not. When the combination of the sensor values is invalid (S108: YES), this flow goes to S110.

At S110, the IC 24 determines whether or not each of all the sensor values is equal to or lower than the threshold value. When each of all the sensor values is equal to or lower than the threshold value (S110: YES), this flow returns to S100. On the other hand, when not all the sensor values are each equal to or lower than the threshold value (S110: NO), this flow repeats the processing at S110. The state in which each of all the sensor values is equal to or lower than the threshold value is a state in which the user's finger does not approach or contact the touch panel 14, for example.

On the other hand, when the combination of the sensor values is valid at S108 (S108: NO), this flow goes to S112. At S112, the IC 24 determines whether or not the user has touched a button that is valid for a current state of the MFP 10. Specifically, the IC 24 determines whether input for the twelve numeric-keypad touch buttons is allowed or not. That is, when the twelve numeric-keypad touch buttons are displayed as illustrated in FIG. 2A, the IC 24 determines that the input for the touch buttons is allowed, and when the twelve numeric-keypad touch buttons are not displayed as illustrated in FIG. 2C, the IC 24 determines that the input for the touch buttons is not allowed. When the valid button is not touched (S112: NO), this flow goes to S114.

At S114, the IC 24 determines whether or not each of all the sensor values is equal to or lower than the threshold value. When each of all the sensor values is equal to or lower than the threshold value (S114: YES), this flow returns to S100. On the other hand, when not all the sensor values are each equal to or lower than the threshold value (S114: NO), this flow repeats the processing at S114.

On the other hand, when the valid button is touched (S112: YES), this flow goes to S116. At S116, the IC 24 executes a processing for a button operation related to the combination of the sensor values, and this flow ends.

<Comparison between Board 18 of Touch Panel 14 in First Embodiment and Board of another Touch Panel>

Figure 6:
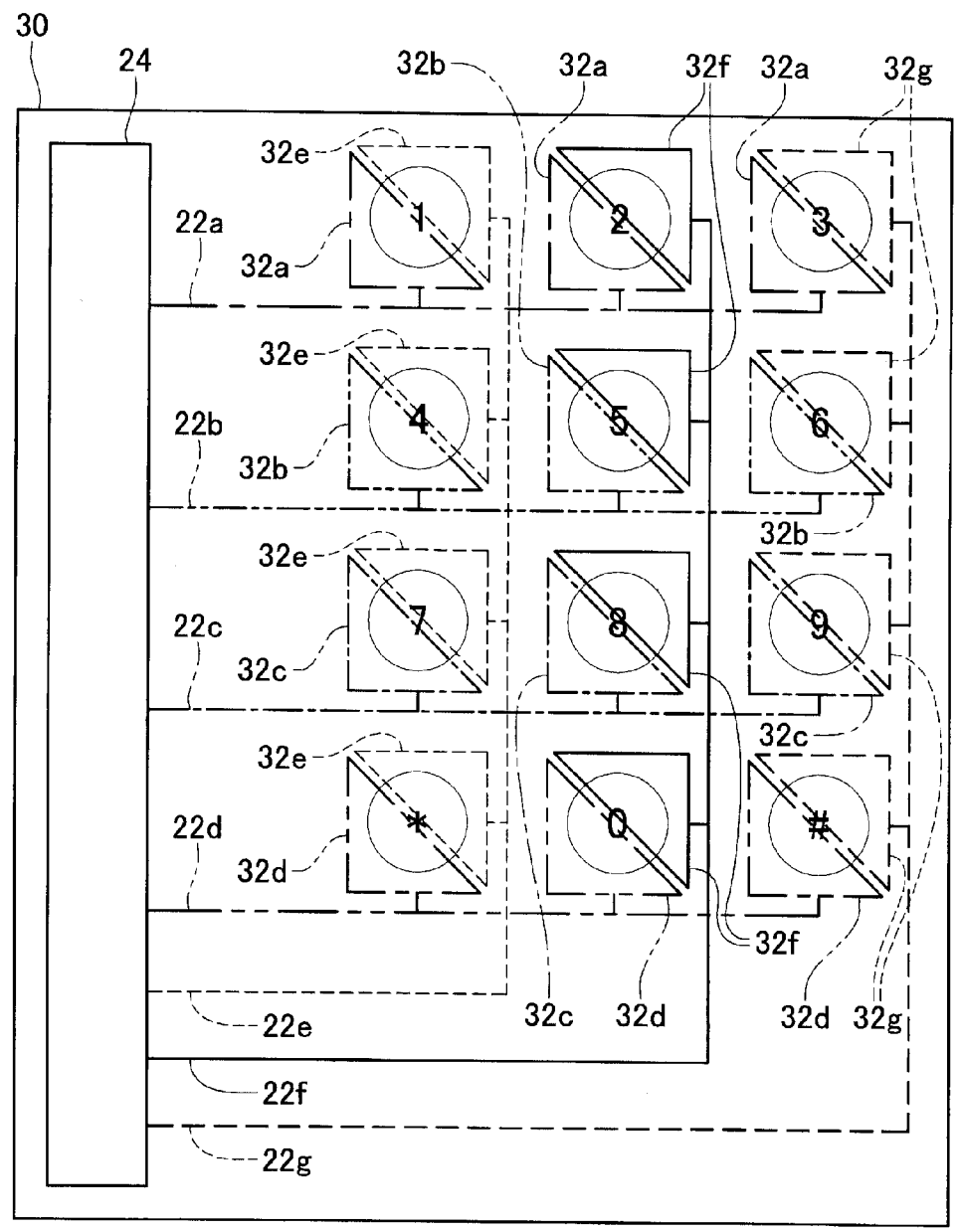
FIG. 6 is a view schematically illustrating a board 30 in a modification.

In the board 18 in the first embodiment, the signal lines 22 and the electrodes 20 are connected to one another in the above-described specific connection pattern. As a comparative example, FIG. 6 illustrates a board 30 on which signal lines and electrodes are connected to one another in a connection pattern that differs from the above-described specific connection pattern. Since the board 30 as the comparative example has a structure similar to that of the board 18 except for an arrangement pattern and the connection pattern of the electrodes, the same reference numerals as used in the first embodiment are used to designate the corresponding elements of the board 30, and an explanation of which is omitted or simply given.

In the board 30 as the comparative example, each electrode 32 has a shape of an isosceles right triangle. Each pair of two electrodes 32 are arranged, with their respective hypotenuses facing each other. These two electrodes 32 form a touch area for one touch button. In the board 30, however, two electrodes 32 constituting one touch area are not arranged such that the two touch areas adjacent to each other are symmetrical to each other, and the electrodes 32 are arranged in the same arrangement pattern in all the touch areas. Specifically, in each of all the touch areas, one of the two electrodes 32 is disposed such that the right angle of its isosceles right triangle is located at a lower left portion of the touch area, and the other of the two electrodes 32 is disposed such that the right angle of its isosceles right triangle is located at an upper right portion of the touch area.

The signal lines 22 and the electrodes 32 are connected to one another in a connection pattern described below.

There will be explained, by way of specific example, a signal line 22*a* corresponding to the touch areas arranged in the uppermost row. The signal line 22*a* is connected to: an electrode 32*a* disposed on a lower left portion of the touch area "1"; an electrode 32*a* disposed on a lower left portion of the touch area "2"; and an electrode 32*a* disposed on a lower left portion of the touch area "3". An electrode 32*e* disposed on an upper right portion of the touch area "1" is connected to a signal line 22*e*, an electrode 32*f* disposed on an upper right portion of the touch area "2" is connected to a signal line 22*f*, and an electrode 32*g* disposed on an upper right portion of the touch area "3" is connected to a signal line 22*g*.

In this arrangement, the electrode 32*a* (as one example of the first electrode unit) disposed on the touch area "2" (as one example of the second input detector) is adjacent to the electrode 32*e* (as one example of the second electrode unit) disposed on the touch area "1" (as one example of the first input detector). The electrode 32*a* (as one example of the first electrode unit) disposed on the touch area "3" (as one example of the second input detector) is adjacent to the electrode 32*f* (as one example of the second electrode unit) disposed on the touch area "2" (as one example of the first input detector).

The signal line 22*e* corresponding to the touch areas contained in the left column will be explained next. The signal line 22*e* is connected to: the electrode 32*e* disposed on the upper right portion of the touch area "1"; an electrode 32*e* disposed on an upper right portion of the touch area "4"; an electrode 32*e* disposed on an upper right portion of the touch area "7"; and the electrode 32*e* disposed on an upper right portion of the touch area "*". The electrode 32*a* disposed on the lower left portion of the touch area "1" is connected to the signal line 22*a*, an electrode 32*b* disposed on a lower left portion of the touch area "4" is connected to a signal line 22*b*, an electrode 32*c* disposed on a lower left portion of the touch area "7" is connected to a signal line 22*c*, and an electrode 32*d* disposed on a lower left portion of the touch area "*" is connected to a signal line 22*d*.

In this arrangement, the electrode 32*e* (as one example of the first electrode unit) disposed on the touch area "4" (as one example of the second input detector) is adjacent to the electrode 32*a* (as one example of the second electrode unit) disposed on the touch area "1" (as one example of the first input detector). The electrode 32*e* (as one example of the first electrode unit) disposed on the touch area "7" (as one example of the second input detector) is adjacent to the electrode 32*b* (as one example of the second electrode unit) disposed on the touch area "4" (as one example of the first input detector). The electrode 32*e* (as one example of the first electrode unit) disposed on the touch area "*" (as one example of the second input detector) is adjacent to the electrode 32*c* (as one example of the second electrode unit) disposed on the touch area "7" (as one example of the first input detector).

Also in the board 30 as the comparative example, when the input object approaches one touch area, two electrodes 32 respectively output two different sensor values to two different signal lines 22, and the button operation is performed on the basis of the two sensor values. However, in the board 30, there is a risk of causing a button operation unintended by the user. Specifically, when the input object approaches a position between two touch areas, there is a possibility that the IC 24 determines that one of the two touch areas has been touched, causing an unintentional button operation. There will be explained reasons for the occurrence of the unintentional button operation.

For example, in a case where the input object approaches a position between the touch area "1" and the touch area "2", sensor values are output from the electrode 32*e* disposed on the touch area "1" and the electrode 32*a* disposed on the touch area "2". Thus, the sensor value SEN00 and the sensor value SEN04 are input to the IC 24. As illustrated in FIG. 4, this combination of the sensor values corresponds to the touch button "1". Thus, even though the input object has approached the position between the touch area "1" and the touch area "2", it is determined that the touch button "1" has been pressed. This is because, as seen from FIG. 6, the touch area corresponding to the touch button "1" is constituted by the electrode 32*a* and the electrode 32*e*.

Also, for example, in a case where the input object approaches a position between the touch area "1" and the touch area "4", sensor values are output from the electrode 32*a* disposed on the touch area "1" and the electrode 32*e* disposed on the touch area "4". Thus, the sensor value SEN00 and the sensor value SEN04 are input to the IC 24. As illustrated in FIG. 4, this combination of the sensor values corresponds to the touch button "1". Thus, even though the input object has approached the position between the touch area "1" and the touch area "4", it is determined that the touch button "1" has been pressed. This is because, as seen from FIG. 6, the touch area corresponding to the touch button "1" is constituted by the electrode 32*a* and the electrode 32*e*.

On the other hand, consider a case where the input object approaches a position between two touch areas in the board 18 in the first embodiment. For example, in the case where the input object approaches a position between the touch area "1" and the touch area "2", as seen from FIG. 3, sensor values are output from the electrode 20*e* disposed on the touch area "1"

and the electrode 20f disposed on the touch area "2". Thus, the sensor value SEN04 and the sensor value SEN05 are input to the IC 24. This combination of the sensor values does not exist in the table illustrated in FIG. 4. In a case where the combination of the sensor values does not exist in the table, the negative decision is made at S108 in FIG. 5, and the button operation is not performed.

Also, for example, in the case where the input object approaches the position between the touch area "1" and the touch area "4", sensor values are output from the electrode 20a disposed on the touch area "1" and the electrode 20b disposed on the touch area "4". Thus, the sensor value SEN00 and the sensor value SEN01 are input to the IC 24. This combination of the sensor values does not exist in the table illustrated in FIG. 4, and the button operation is not performed.

This is because, in the board 18, each of the signal lines 22a-22d respectively corresponding to the rows of the touch areas is connected to an electrode disposed on one touch area and an electrode disposed on a touch area adjacent to the one touch area in a direction in which each of the signal lines 22a-22d extends, such that the electrode disposed on the one touch area and the electrode disposed on the adjacent touch area are not adjacent to each other. Furthermore, this is because, in the board 18, each of the signal lines 22e-22g respectively corresponding to the columns of the touch areas is connected to an electrode disposed on one touch area and an electrode disposed on a touch area adjacent to the one touch area in a direction in which each of the signal lines 22e-22g extends, such that the electrode disposed on the one touch area and the electrode disposed on the adjacent touch area are not adjacent to each other.

As described above, one touch area is constituted by any of a combination of the electrode 20 corresponding to the first electrode unit and the electrode 20 corresponding to the second electrode unit, a combination of the electrode 20 corresponding to the first electrode unit and the electrode 20 corresponding to the third electrode unit, and a combination of the electrode 20 corresponding to the second electrode unit and the electrode 20 corresponding to the fourth electrode unit. In a case where the input object approaches not the position between the two touch areas but one of the touch areas, a signal corresponding to a combination between two electrodes 20 each corresponding to the first electrode unit or a signal corresponding to a combination between two electrodes 20 each corresponding to the second electrode unit is not output. Thus, the button operation in the case where the input object has approached the position between the two touch areas can be made invalid in the board 18, preventing the occurrence of the unintentional button operation.

Figure 7:
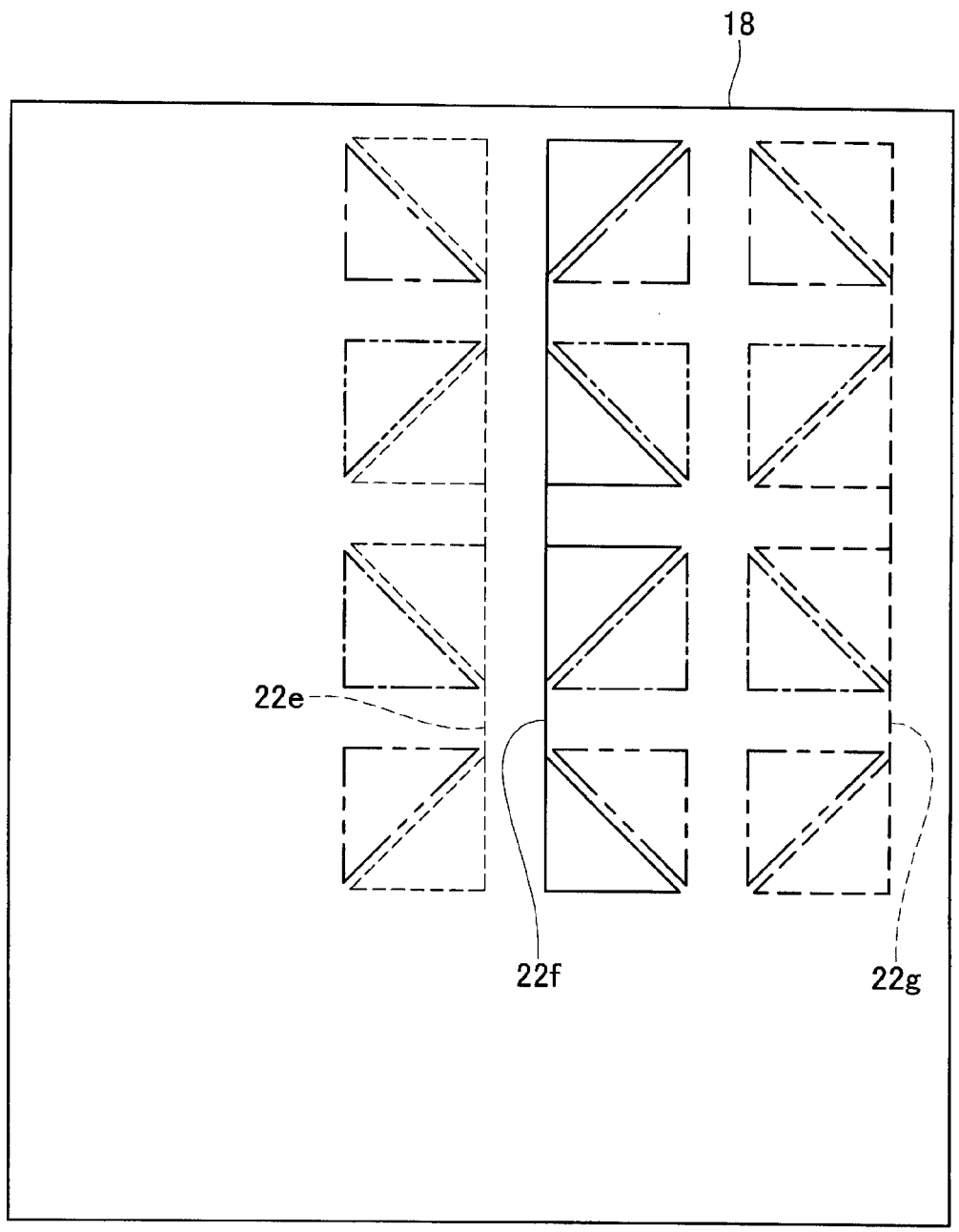
FIG. 7 is a view schematically illustrating a front face of the board 18 illustrated in FIG. 3.

While the electrodes 20, the signal lines 22, and the IC 24 are illustrated in FIG. 3 so as to be arranged on one face of the board 18, FIG. 3 illustrates these components without consideration of front and back faces of the board 18 for easier understanding of the above-described explanation. In reality, as illustrated in FIG. 7, the electrodes 20 and a part of the signal lines 22e-22g are provided on the front face of the board 18. On the other hand, as illustrated in FIG. 8, the IC 24, the signal lines 22a-22d, and a remaining part of the signal lines 22e-22g are provided on the back face of the board 18.

Figure 8:
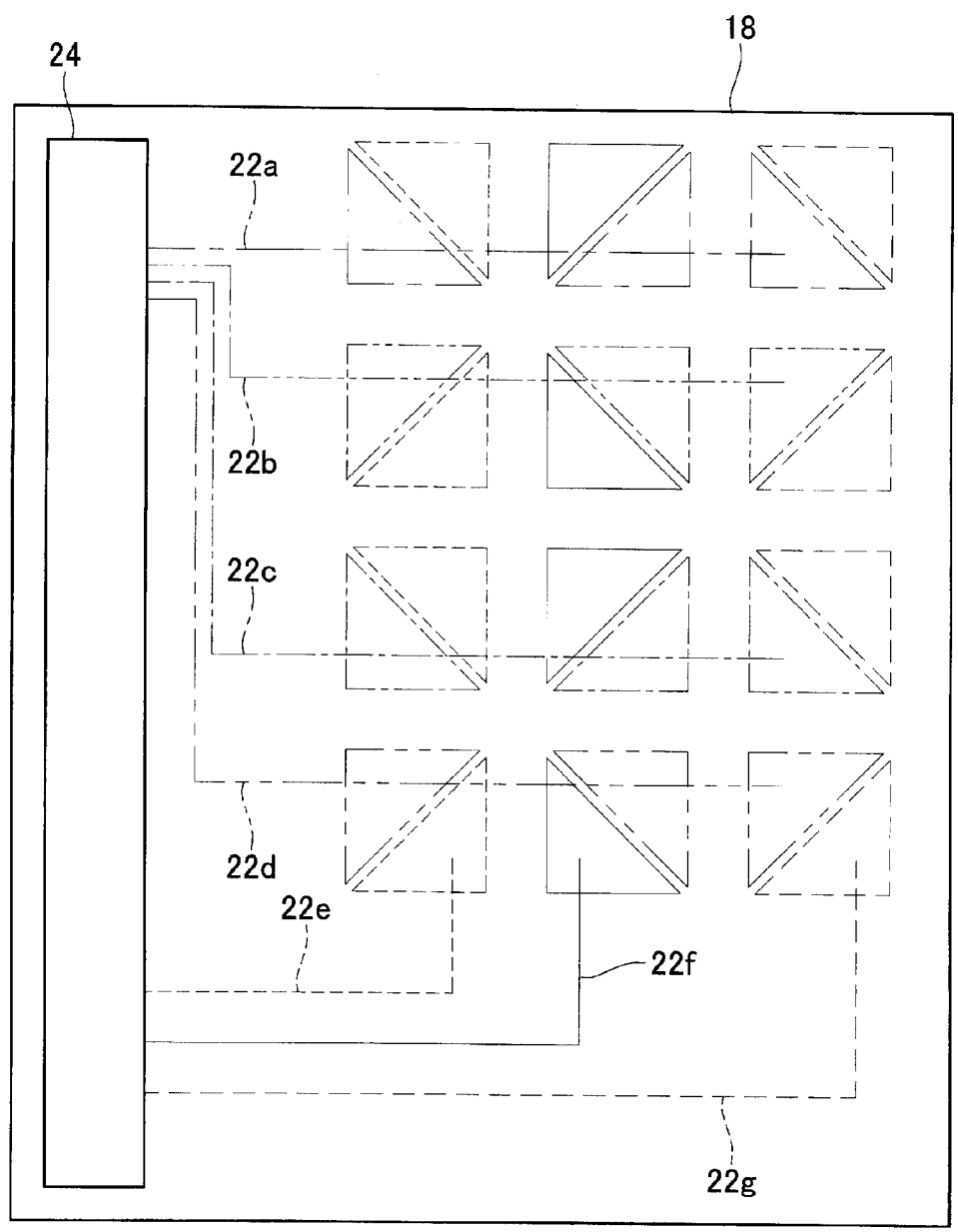
FIG. 8 is a view schematically illustrating a back face of the board 18 illustrated in FIG. 3.

It is noted that, while the electrodes 20 are illustrated in FIG. 8, this is for easier understanding of a relationship between the electrodes 20 and the signal lines 22. That is, the electrodes 20 illustrated in FIG. 8 are transmission images of the electrodes 20 arranged on the front face of the board 18. It is noted that the signal lines 22 provided on the back face and the electrodes 20 provided on the front face are connected to one another via through holes, not shown, formed through the board 18.

In this design, the signal lines 22a-22d respectively corresponding to the rows of the touch areas are routed on one face of the board 18, and a part of each of the signal lines 22e-22g respectively corresponding to the columns of the touch areas is routed on the other face of the board 18, preventing tangling of the signal lines 22a-22d and the signal lines 22e-22g.

Also, as illustrated in FIG. 8, the signal lines 22a-22d respectively corresponding to the rows of the touch areas are connected to the IC 24 as one group, and the signal lines 22e-22g respectively corresponding to the columns of the touch areas are connected to the IC 24 as another group. This also makes it possible to prevent the tangling of the signal lines 22a-22d and the signal lines 22e-22g.

<Second Embodiment>

Figure 9:
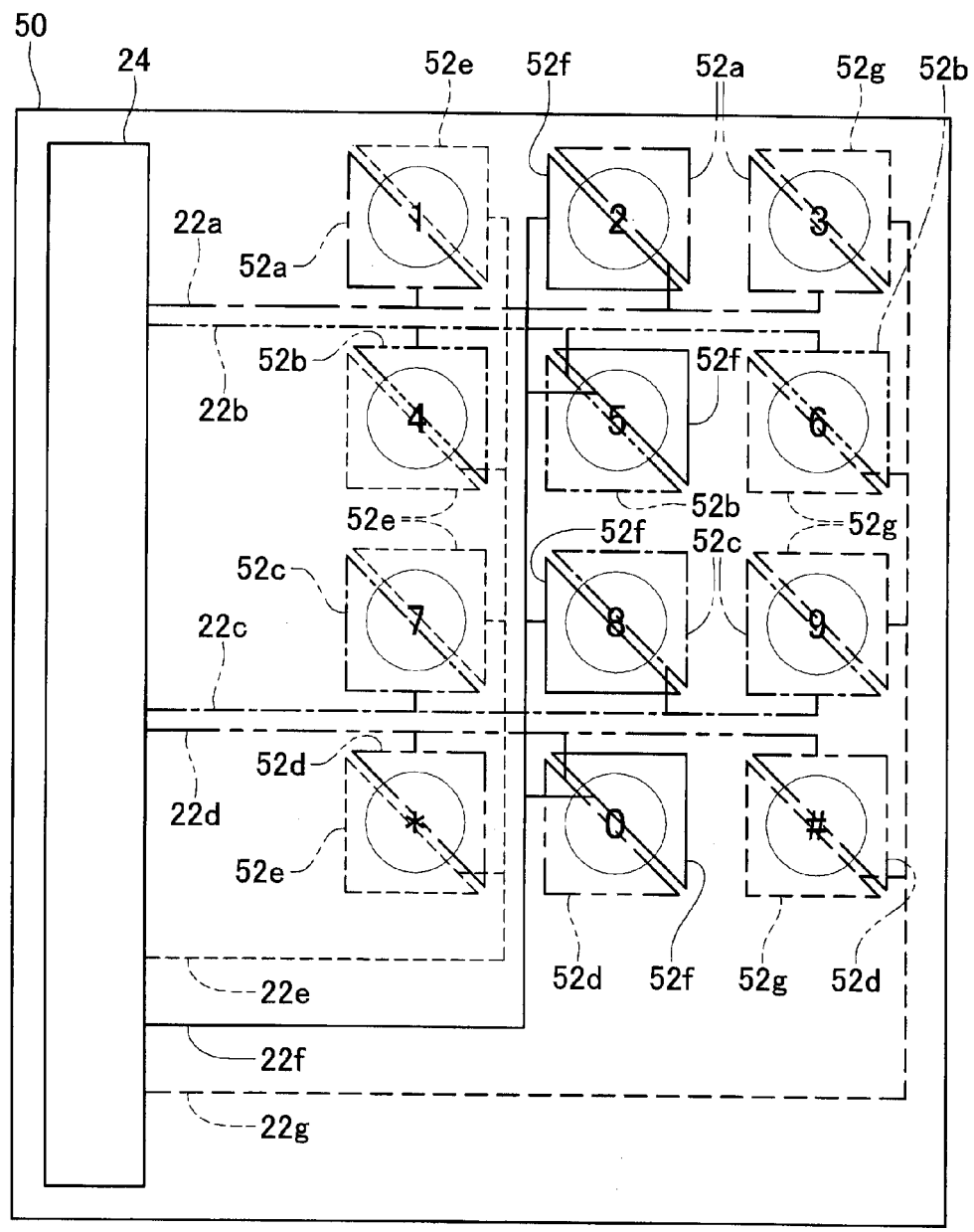
FIG. 9 is a view schematically illustrating a board 50 in a second embodiment.

There will be next explained a board 50 in a second embodiment with reference to FIG. 9. Since the board 50 in the second embodiment has a structure similar to that of the board 30 as the comparative example except for its connection pattern, the same reference numerals as used in the comparative example are used to designate the corresponding elements in this second embodiment, and an explanation of which is omitted or simply given.

Also in this board 50 in the second embodiment, the signal lines 22 and electrodes 52 are connected to one another in the connection pattern similar to that of the board 18 in the first embodiment. There will be explained, by way of specific example, a signal line 22a corresponding to the touch areas arranged in the uppermost row. The signal line 22a is connected to: an electrode 52a disposed on a lower left portion of the touch area "1"; an electrode 52a disposed on an upper right portion of the touch area "2"; and an electrode 52a disposed on a lower left portion of the touch area "3". An electrode 52e disposed on an upper right portion of the touch area "1" is connected to a signal line 22e, an electrode 52f disposed on a lower left portion of the touch area "2" is connected to a signal line 22f, and an electrode 52g disposed on an upper right portion of the touch area "3" is connected to a signal line 22g.

In this arrangement, the electrode 52a (as one example of the first electrode unit) disposed on the touch area "1" (as one example of the first input detector) is not adjacent to the electrode 52f (as one example of the third electrode unit) disposed on the touch area "2" (as one example of the second input detector). The electrode 52a (as one example of the first electrode unit) disposed on the touch area "2" (as one example of the first input detector) is not adjacent to the electrode 52g (as one example of the third electrode unit) disposed on the touch area "3" (as one example of the second input detector).

The signal line 22e corresponding to the touch areas contained in the left column will be explained next. The signal line 22e is connected to: the electrode 52e disposed on the upper right portion of the touch area "1"; an electrode 52e disposed on a lower left portion of the touch area "4"; an electrode 52e disposed on an upper right portion of the touch area "7"; and an electrode 52e disposed on a lower left portion of the touch area "*". The electrode 52a disposed on the lower left portion of the touch area "1" is connected to the signal line 22a, an electrode 52b disposed on an upper right portion of the touch area "4" is connected to a signal line 22b, an electrode 52c disposed on a lower left portion of the touch area "7" is connected to a signal line 22c, and an electrode 52d disposed on an upper right portion of the touch area "*" is connected to a signal line 22d.

In this arrangement, the electrode 52e (as one example of the first electrode unit) disposed on the touch area "1" (as one example of the first input detector) is not adjacent to the electrode 52b (as one example of the third electrode unit) disposed on the touch area "4" (as one example of the second input detector). The electrode 52e (as one example of the first electrode unit) disposed on the touch area "4" (as one example of the first input detector) is not adjacent to the electrode 52c (as one example of the third electrode unit) disposed on the touch area "7" (as one example of the second input detector). The electrode 52e (as one example of the first electrode unit) disposed on the touch area "7" (as one example of the first input detector) is not adjacent to the electrode 52d (as one example of the third electrode unit) disposed on the touch area "*" (as one example of the second input detector).

Therefore, also in the board 50 in the second embodiment, the signal lines 22 and the electrodes 52 are connected to one another in the connection pattern similar to that of the board 18 in the first embodiment, thereby obtaining effects similar to those obtained by the board 18.

<Third Embodiment>

Figure 10:
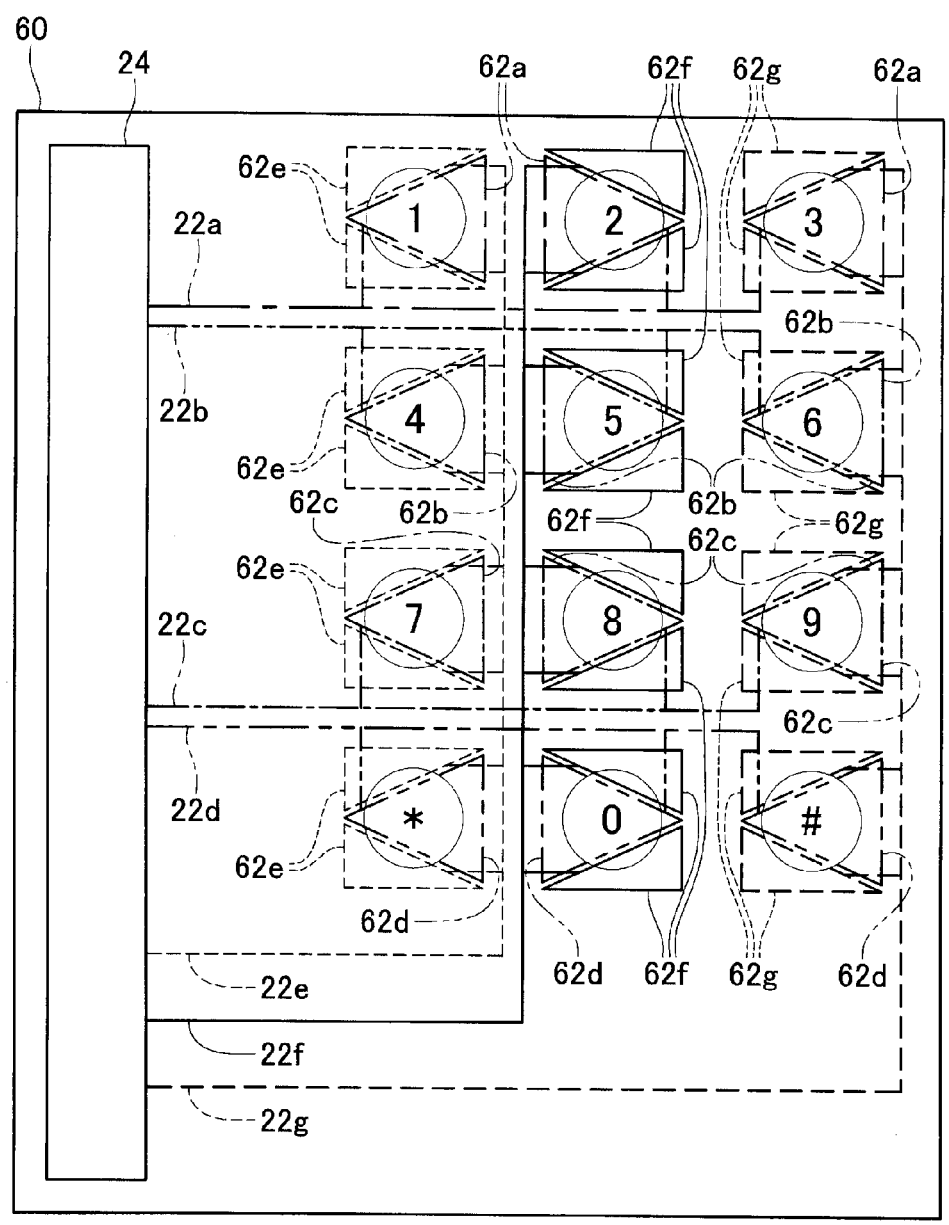
FIG. 10 is a view schematically illustrating a board 60 in a third embodiment.

There will be next explained a board 60 in a third embodiment with reference to FIG. 10. Since the board 60 in the third embodiment has a structure similar to that of the board 18 in the first embodiment except for its connection pattern and the shape of the electrodes, the same reference numerals as used in the first embodiment are used to designate the corresponding elements in this third embodiment, and an explanation of which is omitted or simply given.

In the board 60 in the third embodiment, one touch area is formed by two electrodes 62 each having a right triangle shape and one electrode 62 having an isosceles triangle shape. Specifically, three electrodes 62 are arranged in a state in which a hypotenuse of one of the two right-triangle shaped electrodes 62 faces one of equal-length legs of the isosceles-triangle shaped electrode 62, and the other of the equal-length legs of the isosceles-triangle shaped electrode 62 faces a hypotenuse of the other of the two right-triangle shaped electrodes 62.

Also, the three electrodes 62 constituting one touch area are arranged such that the two touch areas adjacent to each other are symmetrical to each other. Specifically, for example, in the touch area "1", one of two right-triangle shaped electrodes 62 is disposed such that its right angle is located at an upper left portion of the touch area "1", and the other of the two right-triangle shaped electrodes 62 is disposed such that its right angle is located at a lower left portion of the touch area "1". Also, the isosceles-triangle shaped electrode 62 is disposed such that its equal-length legs respectively face the hypotenuses of the respective two right-triangle shaped electrodes 62. In the touch area "2" located on a right side of the touch area "1", one of two right-triangle shaped electrodes 62 is disposed such that its right angle is located at an upper right portion of the touch area "2", and the other of the two right-triangle shaped electrodes 62 is disposed such that its right angle is located at a lower right portion of the touch area. Also, the isosceles-triangle shaped electrode 62 is disposed such that its equal-length legs respectively face the hypotenuses of the respective two right-triangle shaped electrodes 62.

Also in the board 60 in the third embodiment, the signal lines 22 and the electrodes 62 are connected to one another in the connection pattern similar to that of the board 18 in the first embodiment. There will be explained, by way of specific example, a signal line 22a corresponding to the touch areas arranged in the uppermost row. The signal line 22a is connected to: an electrode 62a disposed on a right portion of the touch area "1"; an electrode 62a disposed on a left portion of the touch area "2"; and an electrode 62a disposed on a right portion of the touch area "3". Two electrodes 62e respectively arranged on left portions of the touch area "1" are connected to a signal line 22e, two electrodes 62f respectively arranged on right portions of the touch area "2" are connected to a signal line 22f, and two electrodes 62g respectively arranged on left portions of the touch area "3" is connected to a signal line 22g.

In this arrangement, the electrode 62a (as one example of the first electrode unit) disposed on the touch area "1" (as one example of the first input detector) is not adjacent to the two electrodes 62f (as one example of the third electrode unit) arranged on the touch area "2" (as one example of the second input detector). The electrode 62a (as one example of the first electrode unit) disposed on the touch area "2" (as one example of the second input detector) is not adjacent to the two electrodes 62g (as one example of the third electrode unit) arranged on the touch area "3" (as one example of the second input detector).

The signal line 22e corresponding to the touch areas contained in the left column will be explained next. The signal line 22e is connected to: the two electrodes 62e respectively arranged on the left portions of the touch area "1"; two electrodes 62e respectively arranged on left portions of the touch area "4"; two electrodes 62e respectively arranged on left portions of the touch area "7"; and two electrodes 62e respectively arranged on left portions of the touch area "*". The electrode 62a disposed on the right portion of the touch area "1" is connected to the signal line 22a, an electrode 62b disposed on a right portion of the touch area "4" is connected to a signal line 22b, an electrode 62c disposed on a right portion of the touch area "7" is connected to a signal line 22c, and an electrode 62d disposed on a right portion of the touch area "*" is connected to a signal line 22d.

In this arrangement, the two electrodes 62e (as one example of the first electrode unit) arranged on the touch area "1" (as one example of the first input detector) are not adjacent to the electrode 62b (as one example of the third electrode unit) disposed on the touch area "4" (as one example of the second input detector). The two electrodes 62e (as one example of the first electrode unit) arranged on the touch area "4" (as one example of the first input detector) are not adjacent to the electrode 62c (as one example of the third electrode unit) disposed on the touch area "7" (as one example of the second input detector). The two electrodes 62e (as one example of the first electrode unit) arranged on the touch area "7" (as one example of the first input detector) are not adjacent to the electrode 62d (as one example of the third electrode unit) disposed on the touch area "*" (as one example of the second input detector).

Therefore, also in the board 60 in the third embodiment, the signal lines 22 and the electrodes 62 are connected to one another in the connection pattern similar to that of the board 18 in the first embodiment, thereby obtaining effects similar to those obtained by the board 18.

Furthermore, in the board 60 in the third embodiment, the electrode for constituting one touch area is divided into the two electrodes 62e, 62f, or 62g, so that one touch area is formed by three electrodes. This design results in a smaller area of each of the electrodes 62 forming one touch area, allowing a small input object to cause the two electrodes to react appropriately. This is because too large area of the electrode and a small input object cause a reaction of only one electrode.

<Fourth Embodiment>

Figure 11:
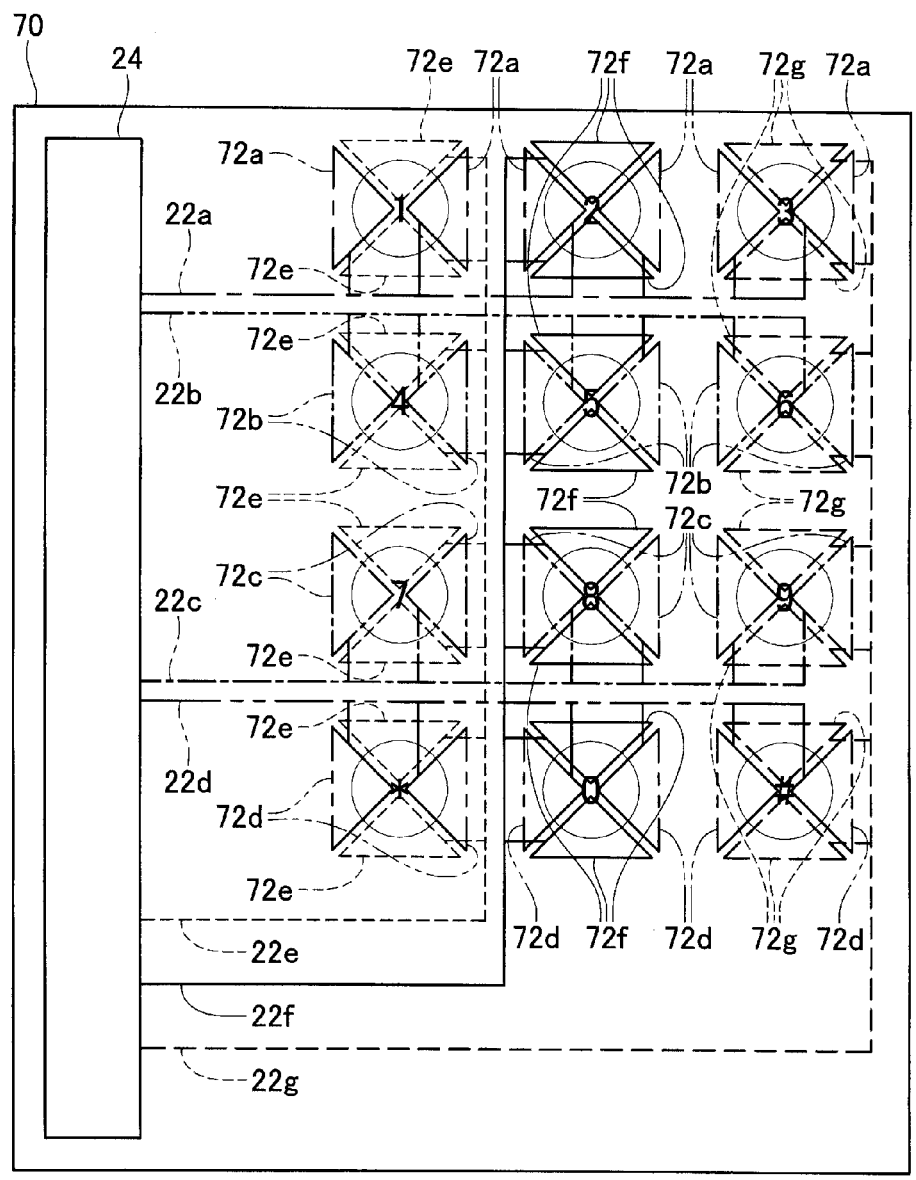
FIG. 11 is a view schematically illustrating a board 70 in a fourth embodiment.

There will be next explained a board 70 in a fourth embodiment with reference to FIG. 11. Since the board 70 in the fourth embodiment has a structure similar to that of the board 18 in the first embodiment except for its connection pattern and the shape of the electrodes, the same reference numerals as used in the first embodiment are used to designate the corresponding elements in this fourth embodiment, and an explanation of which is omitted or simply given.

In the board 70 in the fourth embodiment, one touch area has a square shape formed by four electrodes 72 each having a right triangle shape. Specifically, the four right-triangle shaped electrodes 72 are arranged in a state in which their respective hypotenuses face one another.

Also in the board 70 in the fourth embodiment, the signal lines 22 and the electrodes 72 are connected to one another in the connection pattern similar to that of the board 18 in the first embodiment. There will be explained, by way of specific example, a signal line 22a corresponding to the touch areas arranged in the uppermost row. The signal line 22a is connected to: two electrodes 72a respectively arranged on right and left portions of the touch area "1", two electrodes 72a respectively arranged on right and left portions of the touch area "2"; and two electrodes 72a respectively arranged on right and left portions of the touch area "3". Two electrodes 72e respectively arranged on upper and lower portions of the touch area "1" are connected to a signal line 22e, two electrodes 72f respectively arranged on upper and lower portions of the touch area "2" are connected to a signal line 22f, and two electrodes 72g respectively arranged on upper and lower portions of the touch area "3" are connected to a signal line 22g.

In this arrangement, the electrodes 72a (as one example of the first electrode unit) arranged on the touch area "1" (as one example of the first input detector) are not adjacent to the electrodes 72f (as one example of the third electrode unit) arranged on the touch area "2" (as one example of the second input detector). The electrodes 72a (as one example of the first electrode unit) arranged on the touch area "2" (as one example of the first input detector) are not adjacent to the electrodes 72g (as one example of the third electrode unit) arranged on the touch area "3" (as one example of the second input detector).

The signal line 22e corresponding to the touch areas contained in the left column will be explained next. The signal line 22e is connected to: the two electrodes 72e respectively arranged on the upper and lower portions of the touch area "1"; two electrodes 72e respectively arranged on upper and lower portions of the touch area "4"; two electrodes 72e respectively arranged on upper and lower portions of the touch area "7"; and two electrodes 72e respectively arranged on upper and lower portions of the touch area "*". The two electrodes 72a respectively arranged on the right and left portions of the touch area "1" are connected to the signal line 22a, two electrodes 72b respectively arranged on right and left portions of the touch area "4" are connected to a signal line 22b, two electrodes 72c respectively arranged on right and left portions of the touch area "7" are connected to a signal line 22c, and two electrodes 72d respectively arranged on right and left portions of the touch area "*" are connected to a signal line 22d.

In this arrangement, the electrodes 72e (as one example of the first electrode unit) arranged on the touch area "1" (as one example of the first input detector) are not adjacent to the electrodes 72b (as one example of the third electrode unit) arranged on the touch area "4" (as one example of the second input detector). The electrodes 72e (as one example of the first electrode unit) arranged on the touch area "4" (as one example of the first input detector) are not adjacent to the electrodes 72c (as one example of the third electrode unit) arranged on the touch area "7" (as one example of the second input detector). The electrodes 72e (as one example of the first electrode unit) arranged on the touch area "7" (as one example of the first input detector) are not adjacent to the electrodes 72d (as one example of the third electrode unit) arranged on the touch area "*" (as one example of the second input detector).

Therefore, also in the board 70 in the fourth embodiment, the signal lines 22 and the electrodes 72 are connected to one another in the connection pattern similar to that of the board 18 in the first embodiment, thereby obtaining effects similar to those obtained by the board 18. Also, since one touch area is formed by four electrodes, a small input object is allowed to cause two electrodes to react appropriately.

<Fifth Embodiment>

Figure 12:
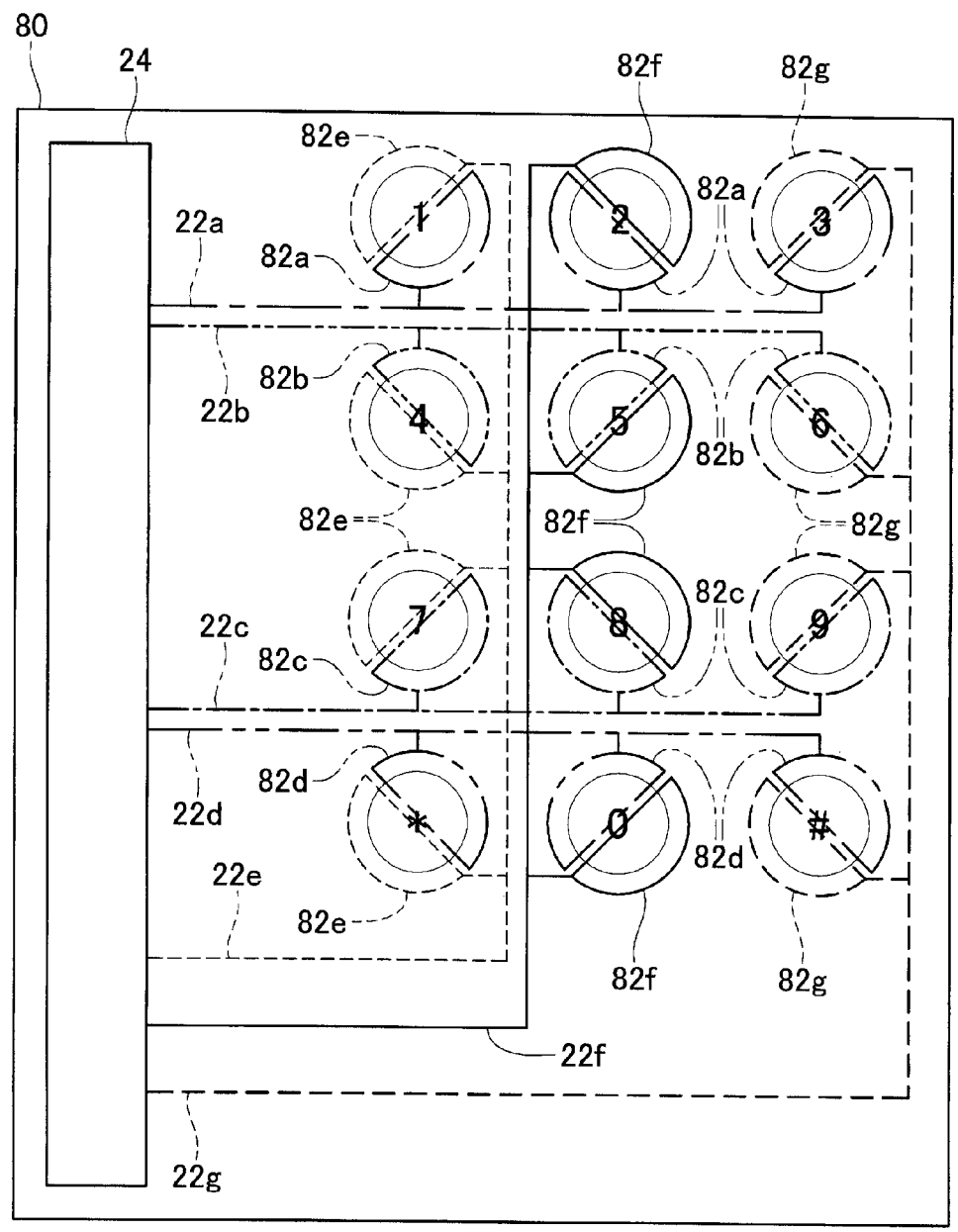
FIG. 12 is a view schematically illustrating a board 80 in a fifth embodiment.

There will be next explained a board 80 in a fifth embodiment with reference to FIG. 12. Since the board 80 in the fifth embodiment has a structure similar to that of the board 18 in the first embodiment except for its connection pattern and the shape of the electrodes, the same reference numerals as used in the first embodiment are used to designate the corresponding elements in this fifth embodiment, and an explanation of which is omitted or simply given.

In the board 80 in the fifth embodiment, one touch area is formed by two electrodes 82 each having a semi-circular shape. Specifically, the two electrodes 82 are arranged, with their respective diameter portions facing each other, so that one circular touch area is formed by the two electrodes 82.

Also, two electrodes 82 constituting one touch area are arranged such that two touch areas adjacent to each other are symmetrical to each other. In this fifth embodiment, each of two electrodes 82 constituting one touch area has such a shape, i.e., the semi-circular shape, that is formed by rounding the right-angle portion of a corresponding one of the two isosceles-right-triangle shaped electrodes 20 constituting the one touch area in the first embodiment. Specifically, for example, in the touch area "1", one of two electrodes 82 is disposed in a state in which its diameter portion faces in an upper left direction, and the other of the two electrodes 82 is disposed in a state in which its diameter portion faces in a lower right direction. On the other hand, in each of the touch area "2" located on a right side of the touch area "1" and the touch area "4" located on a lower side of the touch area "1", one of two electrodes 82 is disposed in a state in which its diameter portion faces in an upper right direction, and the other of the two electrodes 82 is disposed in a state in which its diameter portion faces in a lower left direction.

Also in the board 80 in the fifth embodiment, the signal lines 22 and the electrodes 82 are connected to one another in the connection pattern similar to that of the board 18 in the first embodiment. There will be explained, by way of specific example, a signal line 22a corresponding to the touch areas arranged in the uppermost row. The signal line 22a is connected to: an electrode 82a disposed on a lower right portion of the touch area "1"; an electrode 82a disposed on a lower left portion of the touch area "2"; and an electrode 82a disposed on a lower right portion of the touch area "3". An electrode 82e disposed on an upper left portion of the touch area "1" is connected to the signal line 22e, an electrode 82f disposed on an upper right portion of the touch area "2" is connected to the signal line 22f, and an electrode 82g disposed on an upper left portion of the touch area "3" is connected to the signal line 22g.

In this arrangement, the electrode 82a (as one example of the first electrode unit) disposed on the touch area "1" (as one example of the first input detector) is not adjacent to the electrode 82f (as one example of the third electrode unit) disposed on the touch area "2" (as one example of the second input detector). The electrode 82a (as one example of the first electrode unit) disposed on the touch area "2" (as one example of the second input detector) is not adjacent to the electrode 82g (as one example of the third electrode unit) disposed on the touch area "3" (as one example of the second input detector).

The signal line 22e corresponding to the touch areas contained in the left column will be explained next. The signal line 22e is connected to: the electrode 82e disposed on the upper left portion of the touch area "1"; an electrode 82e disposed on a lower left portion of the touch area "4"; an electrode 82e disposed on an upper left portion of the touch area "7"; and an electrode 82e disposed on a lower left portion of the touch area "a". The electrode 82a disposed on the lower right portion of the touch area "1" is connected to the signal line 22a, an electrode 82b disposed on an upper right portion of the touch area "4" is connected to the signal line 22b, an electrode 82c disposed on a lower right portion of the touch area "7" is connected to the signal line 22c, and an electrode 82d disposed on an upper right portion of the touch area "*" is connected to the signal line 22d.

In this arrangement, the electrode 82e (as one example of the first electrode unit) disposed on the touch area "1" (as one example of the first input detector) is not adjacent to the electrode 82b (as one example of the third electrode unit) disposed on the touch area "4" (as one example of the second input detector). The electrode 82e (as one example of the first electrode unit) disposed on the touch area "4" (as one example of the second input detector) is not adjacent to the electrode 82c (as one example of the third electrode unit) disposed on the touch area "7" (as one example of the second input detector). The electrode 82e (as one example of the first electrode unit) disposed on the touch area "7" (as one example of the first input detector) is not adjacent to the electrode 82d (as one example of the third electrode unit) disposed on the touch area "*" (as one example of the second input detector).

Therefore, also in the board 80 in the fifth embodiment, the signal lines 22 and the electrodes 82 are connected to one another in the connection pattern similar to that of the board 18 in the first embodiment, thereby obtaining effects similar to those obtained by the board 18.

<Sixth Embodiment>

Figure 13:
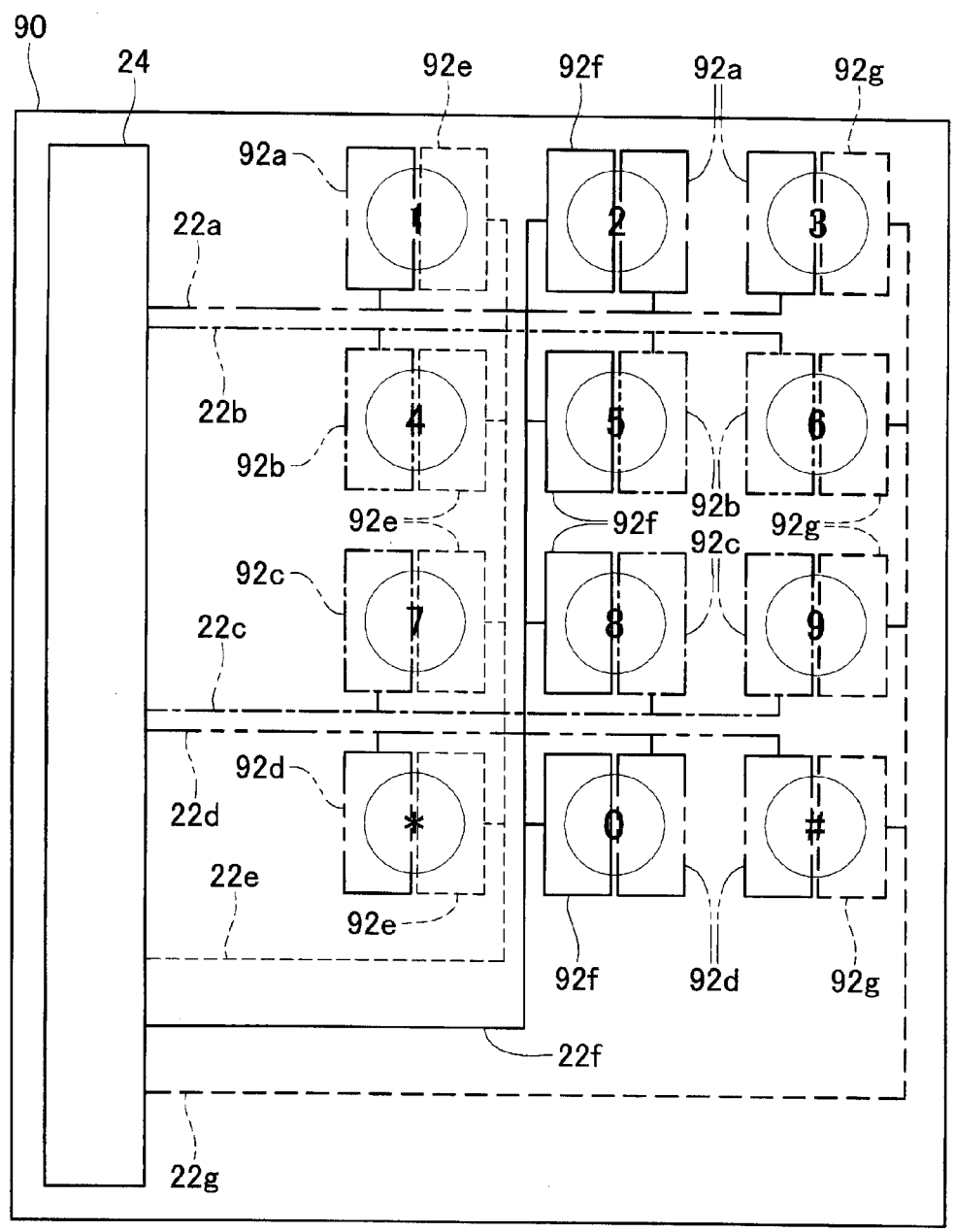
FIG. 13 is a view schematically illustrating a board 90 in a sixth embodiment.

There will be next explained a board 90 in a sixth embodiment with reference to FIG. 13. Since the board 90 in the sixth embodiment has a structure similar to that of the board 18 in the first embodiment except for its connection pattern and the shape of the electrodes, the same reference numerals as used in the first embodiment are used to designate the corresponding elements in this sixth embodiment, and an explanation of which is omitted or simply given.

In the board 90 in the sixth embodiment, one touch area is formed by two rectangular electrodes 92. Specifically, two electrodes 92 are arranged in a state in which their respective long sides face each other, so that one square touch area is formed by the two electrodes 92.

Also, an arrangement pattern of two electrodes 92 constituting one touch area is the same in all the touch areas. Specifically, in each of all the touch areas, the two electrodes 92 are arranged in a state in which their respective long sides face each other in a right and left direction.

Also in the board 90 in the sixth embodiment, the signal lines 22 and the electrodes 92 are connected to one another in the connection pattern similar to that of the board 18 in the first embodiment. There will be explained, by way of specific example, a signal line 22a corresponding to the touch areas arranged in the uppermost row. The signal line 22a is connected to: an electrode 92a disposed on a left portion of the touch area "1"; an electrode 92a disposed on a right portion of the touch area "2"; and an electrode 92a disposed on a left portion of the touch area "3". An electrode 92e disposed on a right portion of the touch area "1" is connected to a signal line 22e, an electrode 92f disposed on a left portion of the touch area "2" is connected to a signal line 22f, and an electrode 92g disposed on a right portion of the touch area "3" is connected to a signal line 22g.

In this arrangement, the electrode 92a (as one example of the first electrode unit) disposed on the touch area "1" (as one example of the first input detector) is not adjacent to the electrode 92f (as one example of the third electrode unit) disposed on the touch area "2" (as one example of the second input detector). The electrode 92a (as one example of the first electrode unit) disposed on the touch area "2" (as one example of the first input detector) is not adjacent to the electrode 92g (as one example of the third electrode unit) disposed on the touch area "3" (as one example of the second input detector).

The signal line 22e corresponding to the touch areas contained in the left column will be explained next. The signal line 22e is connected to the electrode 92e disposed on the right portion of the touch area "1"; an electrode 92e disposed on a right portion of the touch area "4"; an electrode 92e disposed on a right portion of the touch area "7"; and an electrode 92e disposed on a right portion of the touch area "*". The electrode 92a disposed on the left portion of the touch area "1" is connected to a signal line 22a, an electrode 92b disposed on a left portion of the touch area "4" is connected to a signal line 22b, an electrode 92c disposed on a left portion of the touch area "7" is connected to a signal line 22c, and an electrode 92d disposed on a left portion of the touch area "*" is connected to the signal line 22d.

In this arrangement, the electrode 92e (as one example of the first electrode unit) disposed on the touch area "1" (as one example of the first input detector) is not adjacent to the electrode 92b (as one example of the third electrode unit) disposed on the touch area "4" (as one example of the second input detector). The electrode 92e (as one example of the first electrode unit) disposed on the touch area "4" (as one example of the first input detector) is not adjacent to the electrode 92c (as one example of the third electrode unit) disposed on the touch area "7" (as one example of the second input detector). The electrode 92e (as one example of the first electrode unit) disposed on the touch area "7" (as one example of the first input detector) is not adjacent to the electrode 92d (as one example of the third electrode unit) disposed on the touch area "*" (as one example of the second input detector).

Therefore, also in the board 90 in the sixth embodiment, the signal lines 22 and the electrodes 92 are connected to one another in the connection pattern similar to that of the board 18 in the first embodiment, thereby obtaining effects similar to those obtained by the board 18.

<Seventh Embodiment>

Figure 14:
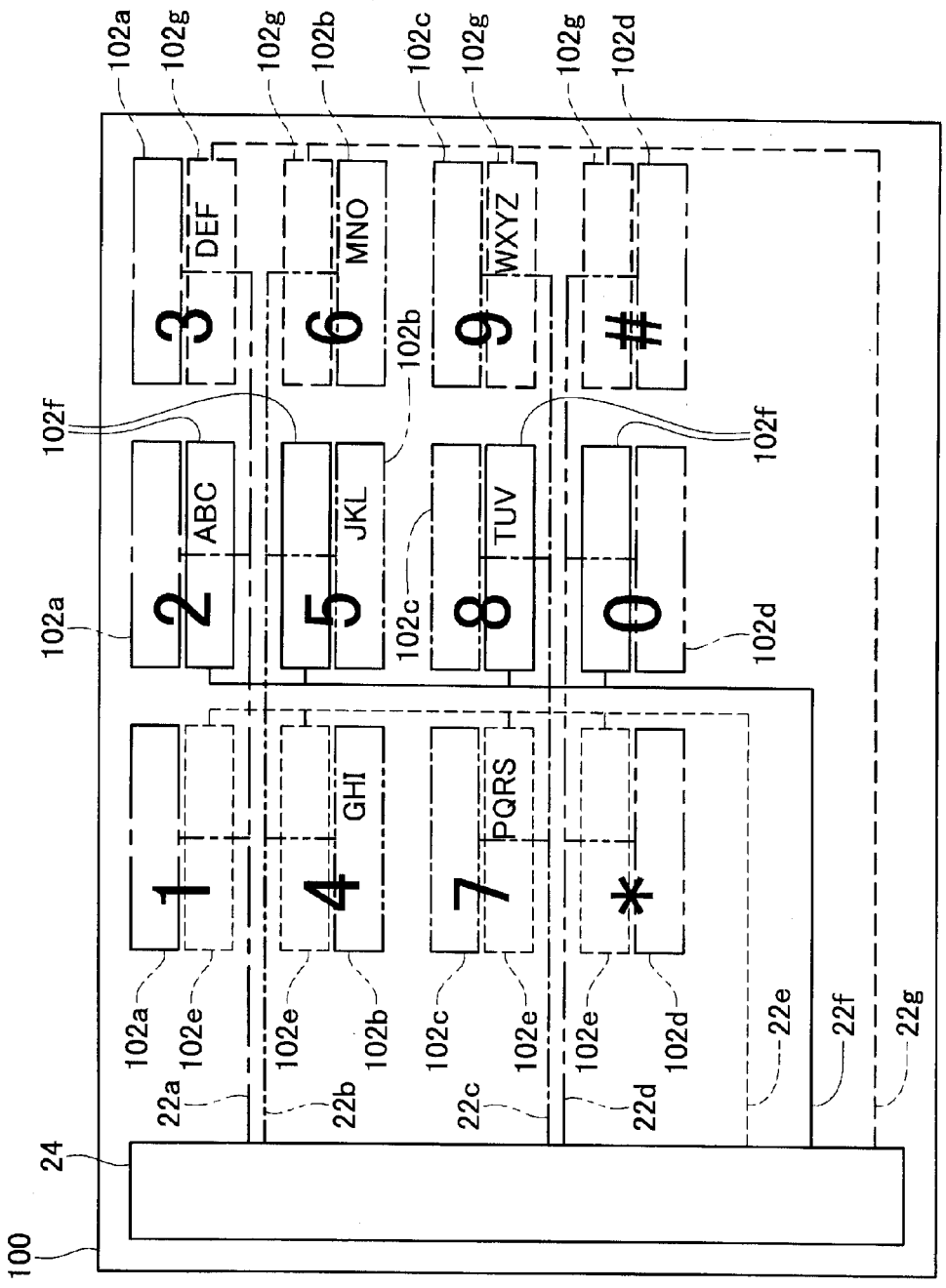
FIG. 14 is a view schematically illustrating a board 100 in a seventh embodiment.

There will be next explained a board 100 in a seventh embodiment with reference to FIG. 14. Since the board 100 in the seventh embodiment has a structure similar to that of the board 18 in the first embodiment except for its connection pattern, the shape of the electrodes, and the signs described on the top coat, the same reference numerals as used in the first embodiment are used to designate the corresponding elements in the seventh embodiment, and an explanation of which is omitted or simply given.

In the board 100 in the seventh embodiment, one touch area is formed by two rectangular electrodes 102. Specifically, the two electrodes 102 are arranged in a state in which their respective long sides face each other, so that one rectangular touch area is formed by the two electrodes 102.

On the top coat covering the board 100, numbers, characters, signs, and other similar information are described in a mobile-phone (smartphone) keypad arrangement at positions respectively opposed to the touch areas. This mobile-phone (smartphone) keypad arrangement has horizontally-oblong touch buttons, on each of which characters such as an alphabet are described on a right side of a corresponding one of the numbers "0"-"9" and the signs "*" and "#". Each touch area of the board 100 has a rectangular shape on which the two electrodes 102 are arranged, with their long sides extending parallel to the right and left direction. Thus, the touch area of the board 100 is suitable for the horizontally-oblong touch button.

Also in the board 100 in the seventh embodiment, the signal lines 22 and the electrodes 102 are connected to one another in the connection pattern similar to that of the board 18 in the first embodiment. There will be explained, by way of specific example, a signal line 22a corresponding to the touch areas arranged in the uppermost row. The signal line 22a is connected to: an electrode 102a disposed on an upper portion of the touch area "1"; an electrode 102a disposed on an upper portion of the touch area "2"; and an electrode 102a disposed on an upper portion of the touch area "3". An electrode 102e disposed on a lower portion of the touch area "1" is connected to a signal line 22e, an electrode 102f disposed on a lower portion of the touch area "2" is connected to a signal line 22f, and an electrode 102g disposed on a lower portion of the touch area "3" is connected to a signal line 22g.

In this arrangement, the electrode 102a (as one example of the first electrode unit) disposed on the touch area "1" (as one example of the first input detector) is not adjacent to the electrode 102f (as one example of the third electrode unit) disposed on the touch area "2"(as one example of the second input detector). The electrode 102a (as one example of the first electrode unit) disposed on the touch area "2" (as one example of the first input detector) is not adjacent to the electrode 102g (as one example of the third electrode unit) disposed on the touch area "3" (as one example of the second input detector).

The signal line 22e corresponding to the touch areas contained in the left column will be explained next. The signal line 22e is connected to: the electrode 102e disposed on the lower portion of the touch area "1"; an electrode 102e disposed on an upper portion of the touch area "4"; an electrode 102e disposed on a lower portion of the touch area "7"; and an electrode 102e disposed on an upper portion of the touch area "*". The electrode 102a disposed on the upper portion of the touch area "1" is connected to the signal line 22a, an electrode 102b disposed on a lower portion of the touch area "4" is connected to a signal line 22b, an electrode 102c disposed on an upper portion of the touch area "7" is connected to a signal line 22c, and an electrode 102d disposed on a lower portion of the touch area "*" is connected to a signal line 22d.

In this arrangement, the electrode 102e (as one example of the first electrode unit) disposed on the touch area "1" (as one example of the first input detector) is not adjacent to electrode 102b (as one example of the third electrode unit) disposed on the touch area "4" (as one example of the second input detector). The electrode 102e (as one example of the first electrode unit) disposed on the touch area "4" (as one example of the first input detector) is not adjacent to the electrode 102c (as one example of the third electrode unit) disposed on the touch area "7" (as one example of the second input detector). The electrode 102e (as one example of the first electrode unit) disposed on the touch area "7" (as one example of the first input detector) is not adjacent to the electrode 102d (as one example of the third electrode unit) disposed on the touch area "*" (as one example of the second input detector).

Therefore, also in the board 100 in the seventh embodiment, the signal lines 22 and the electrodes 102 are connected to one another in the connection pattern similar to that of the board 18 in the first embodiment, thereby obtaining effects similar to those obtained by the board 18.

Furthermore, as illustrated in FIG. 14, the numbers, characters, signs, and other similar information are described on the board 100 in the mobile-phone (smartphone) keypad arrangement, and each touch button has the horizontally-oblong shape. In general, there is a high possibility that the user touches a position of the touch button where the information such as the character and the number is described. Thus, in the case of the horizontally-oblong touch button, the input object may approach a right or left end of the touch button without approaching its central portion. In view of the above, each of the two electrodes 102 constituting the touch area has the horizontally-oblong shape in this board 100. As a result, even if the input object approaches the right or left end of the touch button, the two electrodes 102 can appropriately react to the input object.

<Eighth Embodiment>

Figure 15:
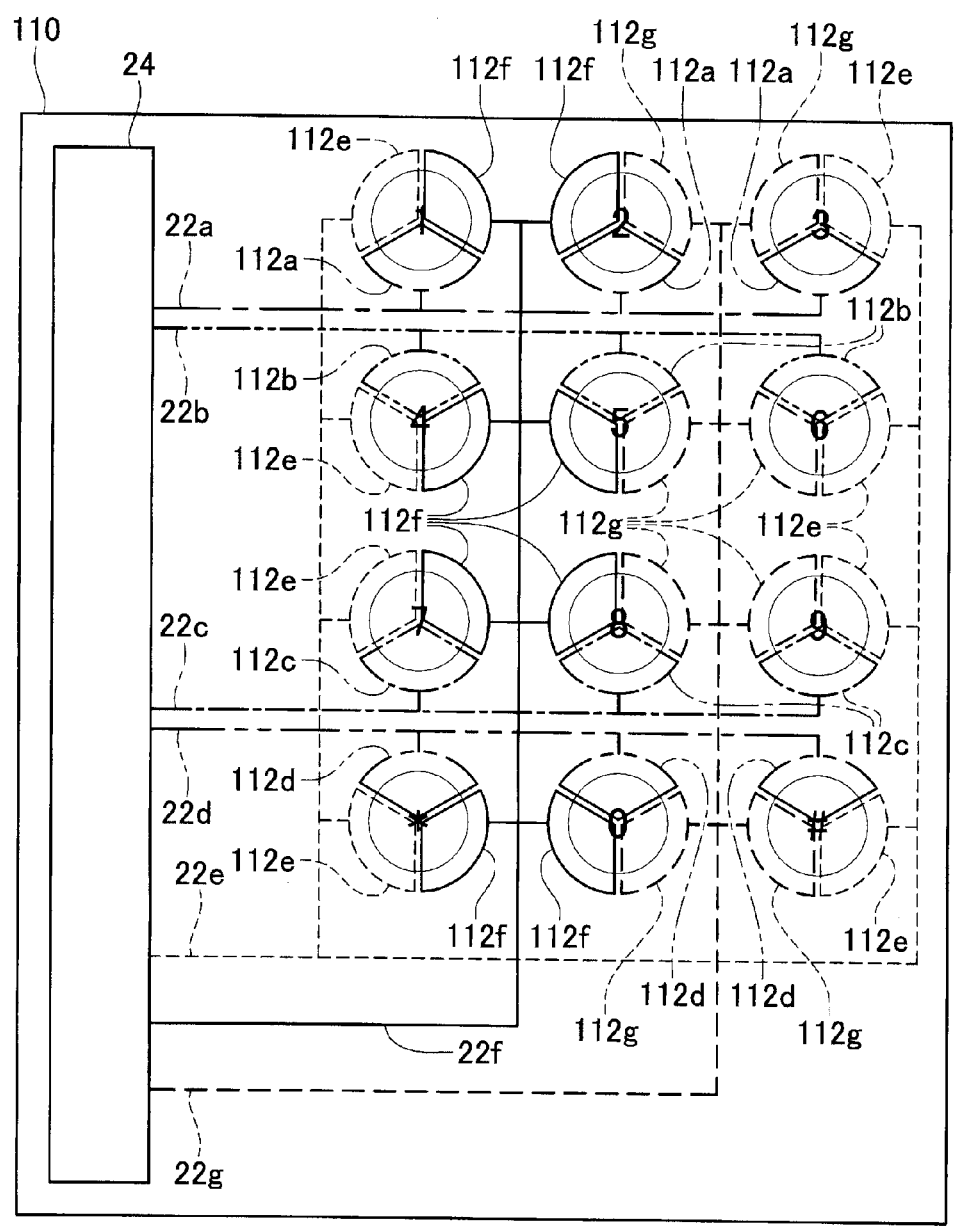
FIG. 15 is a view schematically illustrating a board 110 in an eighth embodiment.

There will be next explained a board 110 in an eighth embodiment with reference to FIG. 15. Since the board 110 in the eighth embodiment has a structure similar to that of the board 18 in the first embodiment except for its connection pattern and the shape of the electrodes, the same reference numerals as used in the first embodiment are used to designate the corresponding elements in the eighth embodiment, and an explanation of which is omitted or simply given.

In the board 110 in the eighth embodiment, one touch area is formed by three electrodes 112 each having a fan shape. Specifically, the three electrodes 112 are arranged in a state in which their respective central angles face one another, so that one circular touch area is formed by the three electrodes 112.

Also, three electrodes 112 constituting one touch area are arranged such that two touch areas adjacent to each other in the up and down direction are symmetrical to each other. Specifically, for example, in the touch area "1", one of three fan-shaped electrodes 112 is disposed such that its central angle is located at an uppermost portion of the electrode 112. Also, each of the other two electrodes 112 is disposed such that its radius portion faces a radius portion of the electrode 112 whose central angle is located at its uppermost portion. On the other hand, in the touch area "4" located on a lower side of the touch area "1", one of three fan-shaped electrodes 112 is disposed such that its central angle is located at a lowermost portion of the electrode 112. Also, each of the other two electrodes 112 is disposed such that its radius portion faces a radius portion of the electrode 112 whose central angle is located at its lowermost portion.

Also, while one touch area is constituted by three electrodes 112, and three signal lines 22 are connected to one touch area in the board 110 in the eighth embodiment, the signal lines 22 and the electrodes 112 are connected to one another in the connection pattern similar to that of the board 18 in the first embodiment.

There will be explained, by way of specific example, a signal line 22a corresponding to the touch areas arranged in the uppermost row. The signal line 22a is connected to: an electrode 112a disposed on a lower portion of the touch area "1"; an electrode 112a disposed on a lower portion of the touch area "2"; and an electrode 112a disposed on a lower portion of the touch area "3". An electrode 112e disposed on an upper left portion of the touch area "1" is connected to a signal line 22e, and an electrode 112f disposed on an upper right portion of the touch area "1" is connected to a signal line 22f. An electrode 112f disposed on an upper left portion of the touch area "2" is connected to the signal line 22f, and an electrode 112g disposed on an upper right portion of the touch area "2" is connected to a signal line 22g. An electrode 112g disposed on an upper left portion of the touch area "3" is connected to the signal line 22g, and an electrode 112e disposed on an upper right portion of the touch area "3" is connected to the signal line 22e.

In this arrangement, the electrode 112a (as one example of the first electrode unit) disposed on the touch area "1" (as one example of the first input detector) is not adjacent to the electrodes 112f, 112g (each as one example of the third electrode unit) arranged on the touch area "2" (as one example of the second input detector). The electrode 112a (as one example of the first electrode unit) disposed on the touch area "2" (as one example of the first input detector) is not adjacent to the electrodes 112e, 112g (each as one example of the third electrode unit) arranged on the touch area "3" (as one example of the second input detector).

The signal line 22e corresponding to the touch areas contained in the left column will be explained next. The signal line 22e is connected to: the electrode 112e disposed on the upper left portion of the touch area "1"; an electrode 112e disposed on a lower left portion of the touch area "4"; an electrode 112e disposed on an upper left portion of the touch area "7"; and an electrode 112e disposed on a lower left portion of the touch area "a". The signal line 22f is connected to: the electrode 112f disposed on the upper right portion of the touch area "1"; an electrode 112f disposed on a lower right portion of the touch area "4"; an electrode 112f disposed on an upper right portion of the touch area "7"; and an electrode 112f disposed on a lower right portion of the touch area "*". The electrode 112a disposed on the lower portion of the touch area "1" is connected to the signal line 22a, an electrode 112b disposed on an upper portion of the touch area "4" is connected to a signal line 22b, an electrode 112c disposed on a lower portion of the touch area "7" is connected to a signal line 22c, and an electrode 112d disposed on an upper portion of the touch area "*" is connected to the signal line 22d.

In this arrangement, the electrodes 112e, 112f (each as one example of the first electrode unit) arranged on the touch area "1" (as one example of the first input detector) are not adjacent to the electrode 112b (as one example of the third electrode unit) disposed on the touch area "4" (as one example of the second input detector). The electrodes 112e, 112f (each as one example of the first electrode unit) arranged on the touch area "4" (as one example of the first input detector) are not adjacent to the electrode 112c (as one example of the third electrode unit) disposed on the touch area "7" (as one example of the second input detector). The electrodes 112e, 112f (each as one example of the first electrode unit) arranged on the touch area "7" (as one example of the first input detector) are not adjacent to the electrode 112d (as one example of the third electrode unit) disposed on the touch area "*" (as one example of the second input detector).

Therefore, also in the board 110 in the eighth embodiment, the signal lines 22 and the electrodes 112 are connected to one another in the connection pattern similar to that of the board 18 in the first embodiment, whereby even where three signal lines 22 are connected to one touch area, it is possible to obtain effects similar to those obtained by the board 18.

Also, even where the connection pattern of the board 110 in the above-described eighth embodiment is slightly changed, for example, it is possible to obtain effects similar to those obtained by the board 18. For example, consider a case where a connection between each of the electrodes 112 and a corresponding one of the signal lines 22 is changed in the touch area "2" without changing a connection between each of the electrodes 112 and a corresponding one of the signal lines 22 in the touch area "1". Specifically, consider a case where the electrode 112f is provided on a lower portion of the touch area "2", the electrode 112a on an upper left portion of the touch area "2", the electrode 112g on an upper right portion of the touch area "2", and the electrode 112f is connected to the signal line 22f, the electrode 112a to the signal line 22a, and the electrode 112g to the signal line 22g.

It is noted that even where three signal lines 22 are connected to one touch area, when a positional relationship of the electrodes in each touch area is made the following relationship, it is possible to obtain effects similar to those obtained in the above-described embodiments. For example, in a case where different signal lines are respectively connected to three electrode units in one touch area, another touch area adjacent to the one touch area contains at least one electrode contained in the one touch area (i.e., at least one common electrode) and an electrode not contained in the one touch area. In this case, when the common electrode contained in the one touch area and the common electrode contained in said another touch area are arranged adjacent to each other or when the electrode different from the common electrode contained in the one touch area and the electrode contained in said another touch area and not contained in the one touch area are arranged adjacent to each other, it is possible to obtain effects similar to those obtained in the above-described embodiments.

<Modifications>

While the plurality of touch buttons are arranged in matrix on the board 18 in the above-described embodiments, the present invention is not limited to this configuration. For example, the plurality of touch buttons may be arranged in one line vertically or horizontally. Also, the plurality of touch buttons do not need to be arranged in a line or lines and may be arranged in any pattern such as a curve pattern and a zigzag pattern. In any arrangement, it is possible to reduce the number of signal lines and prevent the occurrence of the unintentional button operation.

Also, while the shape of the touch area formed by a plurality of electrodes is the square shape, the round shape, or the rectangular shape in the board 18 in the above-described embodiments, the present invention is not limited to this configuration. For example, the shape of the touch area may be any suitable shape such as a star shape, a heart shape, and a polygonal shape such as a triangle shape and a pentagon shape.

Also, while the direction in which the plurality of touch buttons are arranged in each row and the direction in which the plurality of touch buttons are arranged in each column are perpendicular to each other in the board 18 in the above-described embodiments, the present invention is not limited to this configuration. These directions may cross each other diagonally.

The technical elements described in the present specification or the drawings exhibit technical utility individually or in various combinations and are not limited to the combinations disclosed in the claims at the time of filing. Furthermore, the techniques illustrated in the present specification or the drawings may simultaneously achieve a plurality of objects, and have technical utility by achieving one of these objects.

The touch panel 14 is one example of an input device. The touch area is one example of an input detector. Each of the boards 18, 50, 60, 70, 80, 90, 100, 110 is one example of a board. Each of the signal lines 22a-22d is one example of the first signal line. Each of the signal lines 22e-22g is the second signal line. Each of the electrodes 20a-20d, 52a-52d, 62a-62d, 72a-72d, 82a-82d, 92a-92d, 102a-102d, 112a-112d is one example of the first electrode unit. Each of the electrodes 20e-20g, 52e-52g, 62e-62g, 72e-72g, 82e-82g, 92e-92g, 102e-102g, 112e-112g is one example of the second electrode unit. The IC 24 is one example of a controller and a storage. Each of the numbers and signs described on the top coat is one example of a button image. The direction in which the plurality of touch buttons are arranged in each row is one example of the first direction. The direction in which the plurality of touch buttons are arranged in each column is one example of the second direction. Information illustrated in FIG. 4 is one example of information representing that each touch button is associated with a corresponding one of the signal lines.

What is claimed is:

1. An input device, comprising:
a plurality of input detectors comprising a first input detector and a second input detector which are adjacent to each other,
wherein the first input detector comprises:
  a first electrode unit coupled to a first signal line and configured to output an output value to the first signal line, wherein the output value is based on an electrostatic capacity produced between the first electrode unit and an input object when the input object approaches or contacts the first electrode unit; and
  a second electrode unit coupled to a second signal line that differs from the first signal line, the second electrode unit being configured to output an output value to the second signal line, wherein the output value is based on an electrostatic capacity produced between the second electrode unit and the input object when the input object approaches or contacts the second electrode unit,
wherein the second input detector comprises:
  a first electrode unit different from the first electrode unit of the first input detector, the first electrode unit of the second input detector being coupled to the first signal line and configured to output an output value to the first signal line, wherein the output value is based on an electrostatic capacity produced between the first electrode unit of the second input detector and the input object when the input object approaches or contacts the first electrode unit of the second input detector; and
  a third electrode unit coupled to a third signal line that differs from the first signal line and the second signal line, the third electrode unit being configured to output an output value to the third signal line, wherein the output value is based on an electrostatic capacity produced between the third electrode unit and the input object when the input object approaches or contacts the third electrode unit,
wherein the input device further comprises:
a storage configured to store at least (i) information representing that the first input detector is associated with the first signal line and the second signal line and (ii) information representing that the second input detector is associated with the first signal line and the third signal line; and
an output-value receiver coupled to the first signal line, the second signal line, and the third signal line, the output-value receiver being configured to, upon receipt of the output value output from the first signal line and one of the output value output from the second signal line and the output value output from the third signal line, receive, based on the information stored in the storage, an input to one of the first input detector and the second input detector which one is associated with the first signal line and one of the second signal line and the third signal line which have output the output values received by the output-value receiver,
wherein the first input detector and the second input detector are arranged in one of a state in which the first electrode unit of the first input detector and the first electrode unit of the second input detector are adjacent to each other and a state in which the second electrode unit of the first input detector and the third electrode unit of the second input detector are adjacent to each other,
wherein the first input detector and the second input detector are arranged in a first direction,
wherein the plurality of input detectors comprise a third input detector that differs from the first input detector and the second input detector, and the third input detector comprises:
  a second electrode unit different from the second electrode unit of the first input detector, the second electrode unit of the third input detector being coupled to the second signal line and configured to output an output value to the second signal line, wherein the output value is based on an electrostatic capacity produced between the second electrode unit of the third input detector and the input object when the input object approaches or contacts the second electrode unit of the third input detector; and
  a fourth electrode unit coupled to a fourth signal line that differs from the first signal line, the second signal line, and the third signal line, the fourth electrode unit being configured to output an output value to the fourth signal line, wherein the output value is based on an electrostatic capacity produced between the fourth electrode unit and the input object when the input object approaches or contacts the fourth electrode unit,
wherein the first input detector and the third input detector are arranged in a second direction that intersects the first direction,
wherein, when the first input detector and the second input detector are arranged in the state in which the first electrode unit of the first input detector and the first electrode unit of the second input detector are adjacent to each other, the first input detector and the third input detector are arranged in a state in which the second electrode unit of the first input detector and the second electrode unit of the third input detector are adjacent to each other, and
wherein, when the first input detector and the second input detector are arranged in the state in which the second electrode unit of the first input detector and the third electrode unit of the second input detector are adjacent to each other, the first input detector and the third input detector are arranged in a state in which the first electrode unit of the first input detector and the fourth electrode unit of the third input detector are adjacent to each other.

2. The input device according to claim 1,
wherein the first input detector and the second input detector are arranged in one of a state in which the first electrode unit of the first input detector and the third electrode unit of the second input detector are not adjacent to each other and a state in which the second electrode unit of the first input detector and the first electrode unit of the second input detector are not adjacent to each other.

3. The input device according to claim 2,
wherein the plurality of input detectors are arranged in a plurality of rows each extending in the first direction, and each of the plurality of rows comprises a plurality of input detectors arranged in the first direction,
wherein at least one electrode unit of each of the plurality of input detectors arranged in one row of the plurality of rows is connected to one signal line, and
wherein at least one electrode unit of each of the plurality of input detectors arranged in another row of the plurality of rows which differs from the one row is connected to another signal line that differs from the one signal line.

4. The input device according to claim 2,
wherein the plurality of input detectors are arranged in the first direction in a plurality of rows as a plurality of first-direction rows each comprising a plurality of input detectors arranged in the first direction,
wherein a plurality of first-direction-row signal lines are provided respectively for the plurality of first-direction rows,
wherein, in each of the plurality of first-direction rows, each of the plurality of input detectors comprises at least one electrode unit coupled to a corresponding one of the plurality of first-direction-row signal lines,
wherein the plurality of first-direction-row signal lines are coupled to the output-value receiver as a group,
wherein the plurality of input detectors are arranged in a second direction that intersects the first direction in a plurality of rows as a plurality of second-direction rows each comprising a plurality of input detectors arranged in the second direction,
wherein a plurality of second-direction-row signal lines are provided respectively for the plurality of second-direction rows,
wherein, in each of the plurality of second-direction rows, each of the plurality of input detectors comprises at least one electrode unit coupled to a corresponding one of the plurality of second-direction-row signal lines, and
wherein the plurality of second-direction-row signal lines are coupled to the output-value receiver as a group.

5. The input device according to claim 4,
wherein the first electrode unit, the second electrode unit, and the third electrode unit are formed on a board, and the plurality of first-direction-row signal lines are arranged on one face of the board, and
wherein the plurality of second-direction-row signal lines are arranged on another face of the board.

6. The input device according to claim 5, wherein said another face of the board is a face on which the first electrode unit, the second electrode unit, and the third electrode unit are formed.

7. The input device according to claim 2,
wherein the state in which the first electrode unit of the first input detector and the third electrode unit of the second input detector are not adjacent to each other is a state in which the second electrode unit of the first input detector is disposed between the first electrode unit of the first input detector and the third electrode unit of the second input detector, and
wherein the state in which the second electrode unit of the first input detector and the first electrode unit of the second input detector are not adjacent to each other is a state in which the first electrode unit of the first input detector is disposed between the second electrode unit of the first input detector and the first electrode unit of the second input detector.

8. The input device according to claim 1,
wherein the plurality of input detectors are arranged in a plurality of rows each extending in the second direction, and each of the plurality of rows comprises a plurality of input detectors arranged in the second direction,
wherein at least one electrode unit of each of the plurality of input detectors arranged in one row of the plurality of rows is connected to one signal line, and
wherein at least one electrode unit of each of the plurality of input detectors arranged in another row of the plurality of rows which differs from the one row is connected to another signal line that differs from the one signal line.

9. The input device according to claim 1, wherein each of at least one of the first electrode unit, the second electrode unit, and the third electrode unit is constituted by at least two electrodes that are separated from each other.

10. The input device according to claim 1, wherein each of the first electrode unit, the second electrode unit, and the third electrode unit has a triangle shape.

11. The input device according to claim 1, further comprising a board on which the first electrode unit, the second electrode unit, and the third electrode unit are formed, the board being covered with a transparent top coat on which a plurality of button images are described at positions respectively corresponding to the plurality of input detectors,
wherein each of the plurality of button images has a shape extending in a longitudinal direction,
wherein each of the first electrode unit, the second electrode unit, and the third electrode unit has a rectangular shape extending in the longitudinal direction and has a side extending in the longitudinal direction,
wherein the first electrode unit and the second electrode unit are arranged in a state in which the side of the first electrode unit which extends in the longitudinal direction and the side of the second electrode unit which extends in the longitudinal direction face each other, and
wherein the first electrode unit and the third electrode unit are arranged in a state in which the side of the first electrode unit which extends in the longitudinal direction and the side of the third electrode unit which extends in the longitudinal direction face each other.

12. The input device according to claim 1,
wherein the state in which the first electrode unit of the first input detector and the first electrode unit of the second input detector are adjacent to each other is a state in which the second electrode unit of the first input detector and the third electrode unit of the second input detector are not arranged between the first electrode unit of the first input detector and the first electrode unit of the second input detector, and
wherein the state in which the second electrode unit of the first input detector and the third electrode unit of the second input detector are adjacent to each other is a state in which the first electrode unit of the first input detector and the first electrode unit of the second input detector are not arranged between the second electrode unit of the first input detector and the third electrode unit of the second input detector.

13. An input device, comprising:

a plurality of input detectors comprising a first input detector and a second input detector which are directly adjacent to each other, wherein the first input detector comprises:

a first electrode unit directly coupled to a first signal line and configured to output an output value to the first signal line, wherein the output value is based on an electrostatic capacity produced between the first electrode unit and an input object when the input object approaches or contacts the first electrode unit; and a second electrode unit directly coupled to a second signal line that differs from the first signal line, the second electrode unit being configured to output an output value to the second signal line, wherein the output value is based on an electrostatic capacity produced between the second electrode unit and the input object when the input object approaches or contacts the second electrode unit, wherein the second input detector comprises:

a first electrode unit different from the first electrode unit of the first input detector, the first electrode unit of the second input detector being directly coupled to the first signal line and configured to output an output value to the first signal line, wherein the output value is based on an electrostatic capacity produced between the first electrode unit of the second input detector and the input object when the input object approaches or contacts the first electrode unit of the second input detector; and a third electrode unit directly coupled to a third signal line that differs from the first signal line and the second signal line, the third electrode unit being configured to output an output value to the third signal line, wherein the output value is based on an electrostatic capacity produced between the third electrode unit and the input object when the input object approaches or contacts the third electrode unit, wherein the input device further comprises:

a storage configured to store at least (i) information representing that the first input detector is associated with the first signal line and the second signal line and (ii) information representing that the second input detector is associated with the first signal line and the third signal line; and an output-value receiver directly coupled to the first signal line, the second signal line, and the third signal line, the output-value receiver being configured to, upon receipt of the output value output from the first signal line and one of the output value output from the second signal line and the output value output from the third signal line, receive, based on the information stored in the storage, an input to one of the first input detector and the second input detector which one is associated with the first signal line and one of the second signal line and the third signal line which have output the output values received by the output-value receiver, wherein the first input detector and the second input detector are arranged in a state in which the second electrode unit of the first input detector and the third electrode unit of the second input detector are directly adjacent to each other.

* * * * *